(12) United States Patent
Ishikawa et al.

(10) Patent No.: US 12,543,598 B2
(45) Date of Patent: Feb. 3, 2026

(54) LIGHT EMITTING DEVICE, SEMICONDUCTOR STRUCTURE, METHOD OF MANUFACTURING A THIN-FILM LAYER, AND METHOD OF MANUFACTURING A LIGHT EMITTING DEVICE

(71) Applicant: Oki Electric Industry Co., Ltd., Tokyo (JP)

(72) Inventors: Takuma Ishikawa, Tokyo (JP); Takahito Suzuki, Tokyo (JP); Kenichi Tanigawa, Tokyo (JP); Hironori Furuta, Tokyo (JP); Toru Kosaka, Tokyo (JP); Yusuke Nakai, Tokyo (JP); Shinya Jyumonji, Tokyo (JP); Genichirou Matsuo, Tokyo (JP); Chihiro Takahashi, Tokyo (JP); Hiroto Kawada, Tokyo (JP); Yuuki Shinohara, Tokyo (JP); Akihiro Iino, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 719 days.

(21) Appl. No.: 17/884,665

(22) Filed: Aug. 10, 2022

(65) Prior Publication Data
US 2023/0063063 A1    Mar. 2, 2023

(30) Foreign Application Priority Data

Aug. 26, 2021 (JP) .................................. 2021-138382

(51) Int. Cl.
*H01L 25/075* (2006.01)
*H01L 25/16* (2023.01)
(Continued)

(52) U.S. Cl.
CPC ........ *H01L 25/0756* (2013.01); *H01L 25/167* (2013.01); *H10H 20/857* (2025.01); *H10H 20/0364* (2025.01)

(58) Field of Classification Search
None
See application file for complete search history.

(56) References Cited

U.S. PATENT DOCUMENTS

2009/0001391 A1    1/2009 Ogihara et al.
2010/0051975 A1    3/2010 Suzuki et al.
(Continued)

FOREIGN PATENT DOCUMENTS

CN    108780826 A    11/2018
JP    4474441 B2    6/2010
(Continued)

*Primary Examiner* — Khaja Ahmad
(74) *Attorney, Agent, or Firm* — Rabin & Berdo, P.C.

(57) ABSTRACT

A light emitting device includes: a first layer in which a first light emitting element is disposed; a second layer stacked on the first layer and including a second light emitting element that at least partially overlaps the first light emitting element as viewed in a light emitting direction perpendicular to a light emitting surface of the first light emitting element; and a control substrate on which the first layer is stacked and that controls light emission of the first light emitting element and the second light emitting element. The first layer includes a first surface facing the second layer in the light emitting direction, a second surface facing the control substrate in the light emitting direction, and a first opening formed from the first surface to the second surface. The second light emitting element and the control substrate are electrically connected together through the first opening.

14 Claims, 18 Drawing Sheets

(51) Int. Cl.
*H10H 20/01* (2025.01)
*H10H 20/857* (2025.01)

(56) References Cited

U.S. PATENT DOCUMENTS

| | | |
|---|---|---|
| 2019/0103510 A1* | 4/2019 | Cha ...................... H10H 20/813 |
| 2019/0165037 A1* | 5/2019 | Chae .................... H10H 20/857 |
| 2019/0189596 A1* | 6/2019 | Chae ................... H01L 25/0753 |
| 2019/0189681 A1 | 6/2019 | Chae et al. |
| 2022/0246670 A1* | 8/2022 | Chen ...................... H10H 29/10 |

FOREIGN PATENT DOCUMENTS

| | | |
|---|---|---|
| JP | 4555880 B2 | 10/2010 |
| JP | 2021504753 A | 2/2021 |
| WO | 2020263183 A1 | 12/2020 |

* cited by examiner

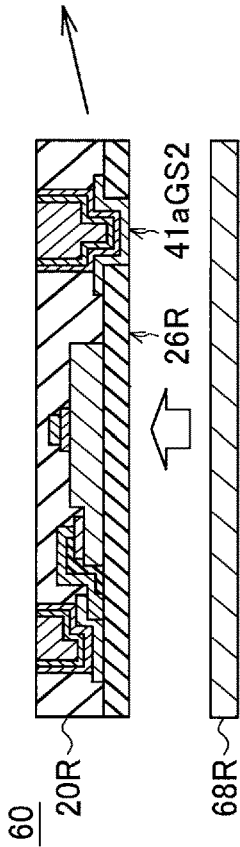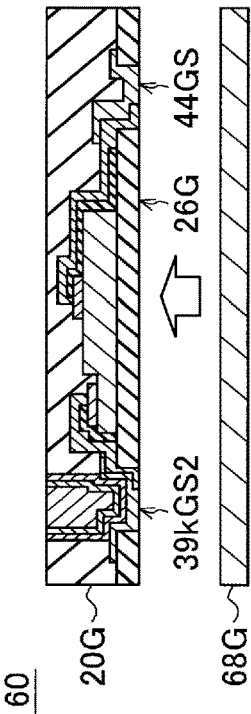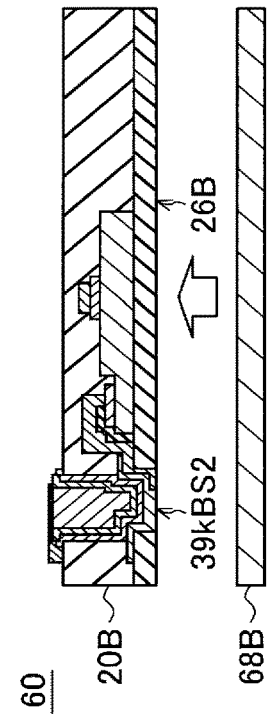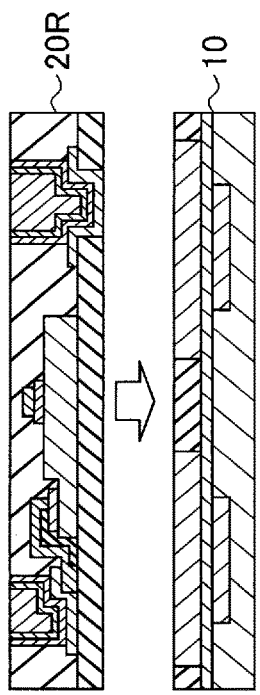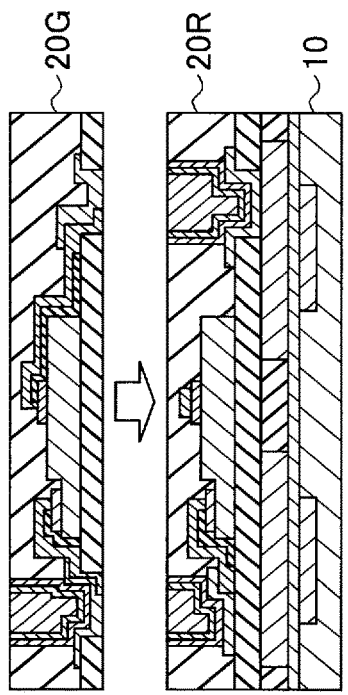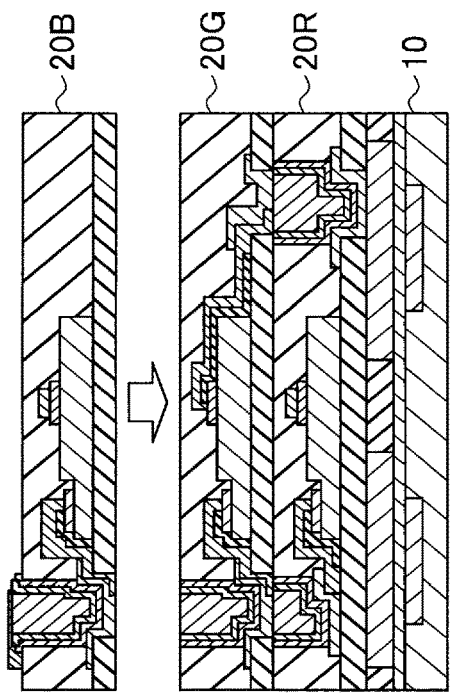
FIG. 12A  FIG. 12B  FIG. 12C

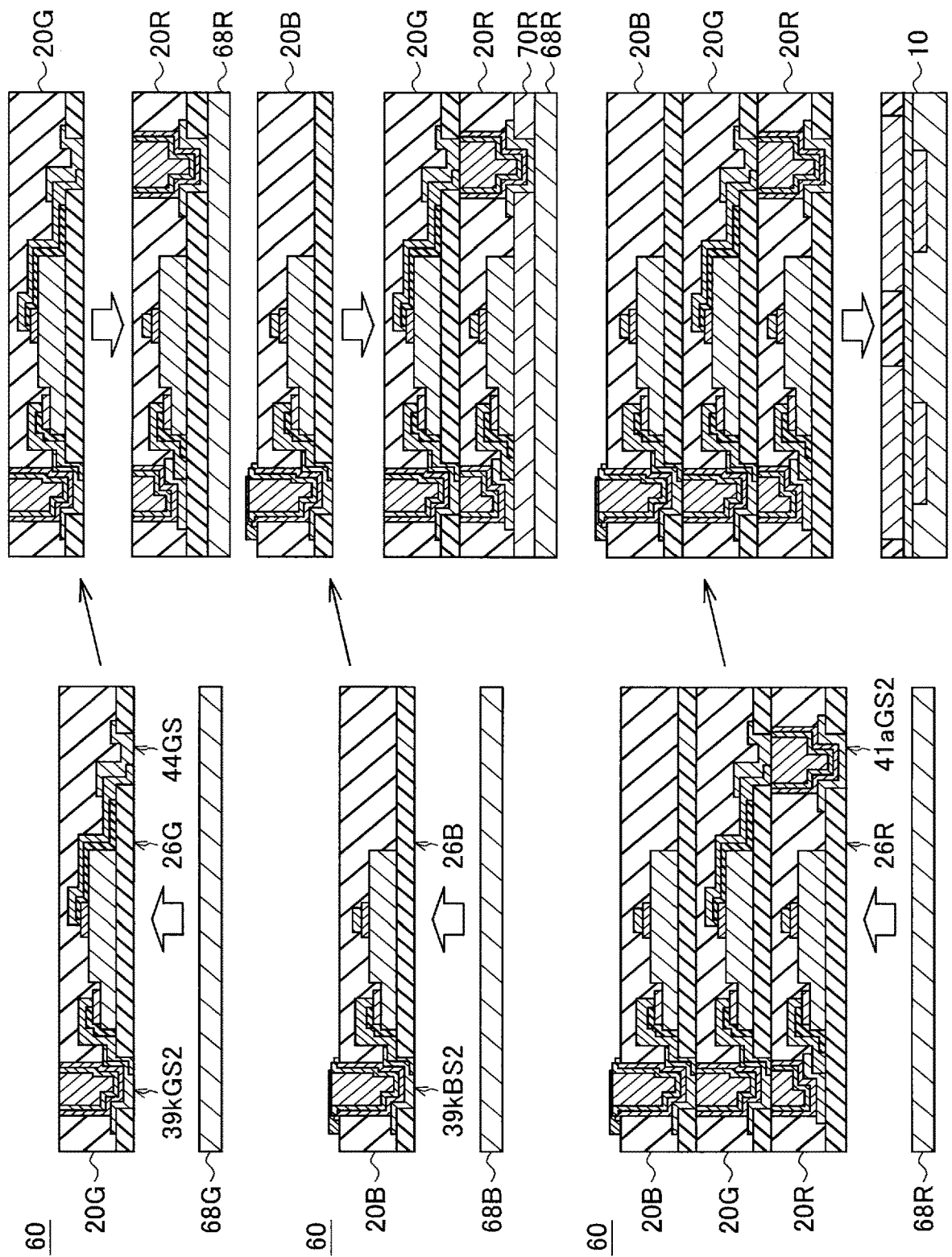

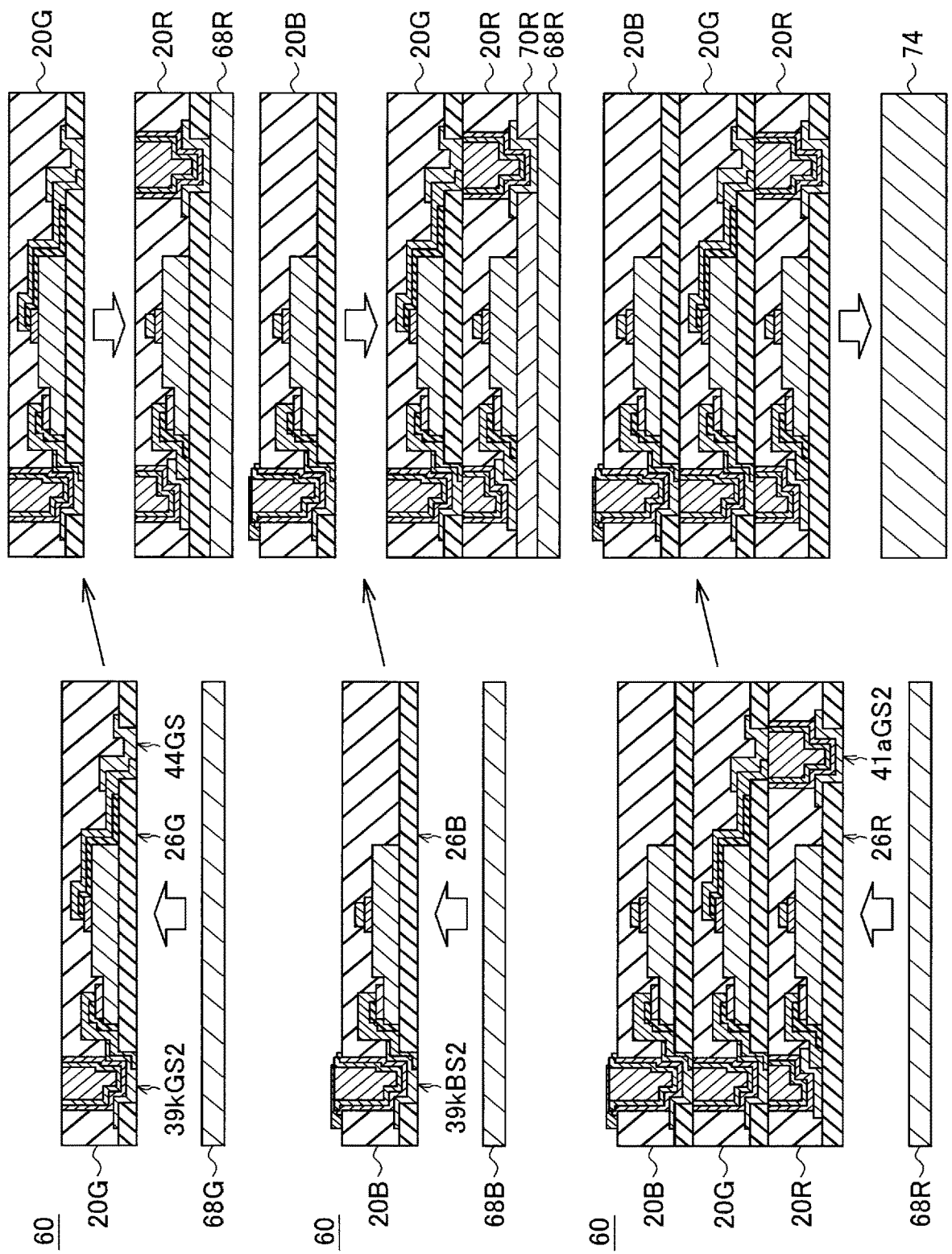

LIGHT EMITTING DEVICE, SEMICONDUCTOR STRUCTURE, METHOD OF MANUFACTURING A THIN-FILM LAYER, AND METHOD OF MANUFACTURING A LIGHT EMITTING DEVICE

BACKGROUND OF THE INVENTION

1. Field of the Invention

The present disclosure relates to a light emitting device, a semiconductor structure, a method of manufacturing a thin-film layer, and a method of manufacturing a light emitting device, and is preferably applied to, for example, a light emitting device in which semiconductor elements are mounted in a circuit substrate.

2. Description of the Related Art

There have been recently proposed light emitting devices that display images by selectively driving multiple semiconductor elements arranged in matrixes on circuit substrates to cause them to emit light (see, e.g., Japanese Patents No. 4474441 and No. 4555880).

In such light emitting devices, it is desired to improve image quality.

SUMMARY OF THE INVENTION

An object of the present disclosure is to provide a light emitting device, a semiconductor structure, a method of manufacturing a thin-film layer, and a method of manufacturing a light emitting device that allow improvement in image quality.

According to an aspect of the present disclosure, there is provided a light emitting device including: a first layer in which a first light emitting element is disposed; a second layer stacked on the first layer and including a second light emitting element that at least partially overlaps the first light emitting element as viewed in a light emitting direction perpendicular to a light emitting surface of the first light emitting element; and a control substrate on which the first layer is stacked and that controls light emission of the first light emitting element and the second light emitting element, wherein the first layer includes a first surface facing the second layer in the light emitting direction, a second surface facing the control substrate in the light emitting direction, and a first opening formed from the first surface to the second surface, and wherein the second light emitting element and the control substrate are electrically connected together through the first opening.

According to another aspect of the present disclosure, there is provided a semiconductor structure including: a substrate; a first layer disposed on the substrate and including a first light emitting element; and a second layer stacked on the first layer in a stacking direction and including a second light emitting element that at least partially overlaps the first light emitting element as viewed in the stacking direction, wherein the first layer includes: a first surface facing the second layer in the stacking direction; a second surface facing the substrate in the stacking direction; an opening formed from the first surface to the second surface; and a first electrode disposed in the opening, and wherein the second layer includes a second electrode overlapping the first electrode as viewed in the stacking direction.

According to another aspect of the present disclosure, there is provided a method of manufacturing a thin-film layer, the method including: (a) forming a first thin-film layer by forming a first insulating layer on a substrate, forming a light emitting element on the first insulating layer by means of intermolecular force, forming in the first insulating layer a first insulating layer opening passing through the first insulating layer, forming a second insulating layer covering the first insulating layer and the light emitting element, forming in the second insulating layer a second insulating layer opening communicating with the first insulating layer opening, forming an electrode in the first insulating layer opening and the second insulating layer opening, and planarizing a surface of the second insulating layer; (b) forming a second thin-film layer by forming a first insulating layer on a substrate, forming a light emitting element on the first insulating layer by means of intermolecular force, forming in the first insulating layer a first insulating layer opening passing through the first insulating layer, forming a second insulating layer covering the first insulating layer and the light emitting element, forming in the second insulating layer a second insulating layer opening communicating with the first insulating layer opening, forming an electrode in the first insulating layer opening and the second insulating layer opening, and planarizing a surface of the second insulating layer; and (c) disposing the formed second thin-film layer on the surface of the second insulating layer of the formed first thin-film layer such that the light emitting element formed in the second thin-film layer overlaps the light emitting element formed in the first thin-film layer, and bonding the electrode of the second thin-film layer to the electrode of the first thin-film layer by means of intermolecular force.

According to another aspect of the present disclosure, there is provided a method of manufacturing the above light emitting device, the method including: bonding the control substrate and the first layer to each other by means of intermolecular force; and bonding the first layer and the second layer to each other by means of intermolecular force.

With the above aspects of the present disclosure, it is possible to provide a light emitting device, a semiconductor structure, a method of manufacturing a thin-film layer, and a method of manufacturing a light emitting device that allow improvement in image quality.

BRIEF DESCRIPTION OF THE DRAWINGS

In the attached drawings:

FIGS. 12A to 12C are cross-sectional views illustrating a process of manufacturing the LED display portion according to a first embodiment;

FIGS. 13A to 13C are cross-sectional views illustrating a process of manufacturing the LED display portion according to a second embodiment;

FIGS. 17A to 17C are cross-sectional views illustrating a process of manufacturing the semiconductor structure according to a fourth embodiment;

DETAILED DESCRIPTION OF THE INVENTION

Embodiments of the present disclosure will be described below with reference to the drawings.

1. First Embodiment

<1-1. Configuration of LED Display Device>

Figure 1:
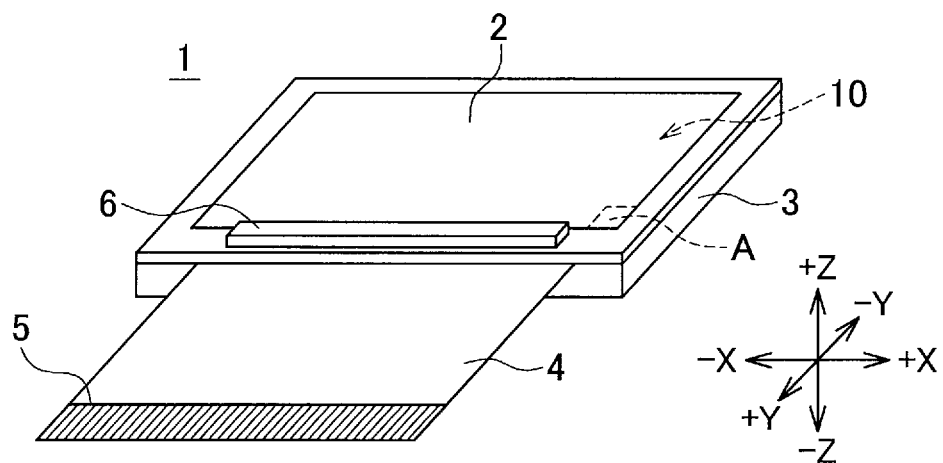
FIG. 1 is a perspective view illustrating a configuration of an LED display device.
Figure 2:
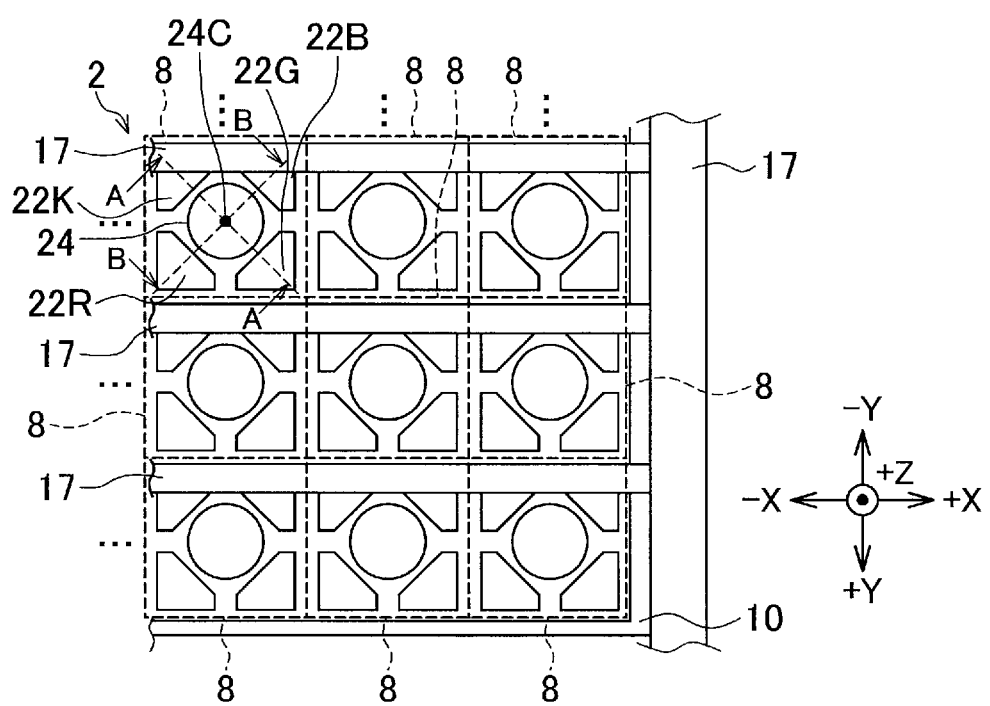
FIG. 2 illustrates a configuration of an LED display portion, and is an enlarged plan view of portion A, which is an area including several pixels, in FIG. 1.

As illustrated in FIGS. 1 and 2, a light emitting diode (LED) display device 1 includes an LED display portion 2, a heat dissipator 3, a connection cable 4, a connection terminal portion 5, a driver 6, and the like. The LED display device 1, which is also referred to as a micro-LED display, is a display device in which a set of red, green, and blue LED elements corresponds to one pixel. Specifically, the LED display portion 2 is a display device in which elements each including inorganic LEDs are arranged in a matrix on a circuit substrate (or board) 10, each element serving as one pixel. The circuit substrate 10 is a substrate in which a wiring layer and driving elements or driving circuitry connected to the wiring layer are disposed, and that provides electrical connection with the LEDs to selectively drive the LEDs in the pixels. Hereinafter, the rightward direction on the drawing sheet of FIG. 1 is taken as a +X direction, the leftward direction on the drawing sheet is taken as a −X direction, the leftward and downward direction on the drawing sheet is taken as a +Y direction, the rightward and upward direction is taken as a −Y direction, the upward direction on the drawing sheet is taken as a +Z direction, and the downward direction on the drawing sheet is taken as a −Z direction.

<1-2. Entire Configuration of LED Display Portion>

Figure 4:
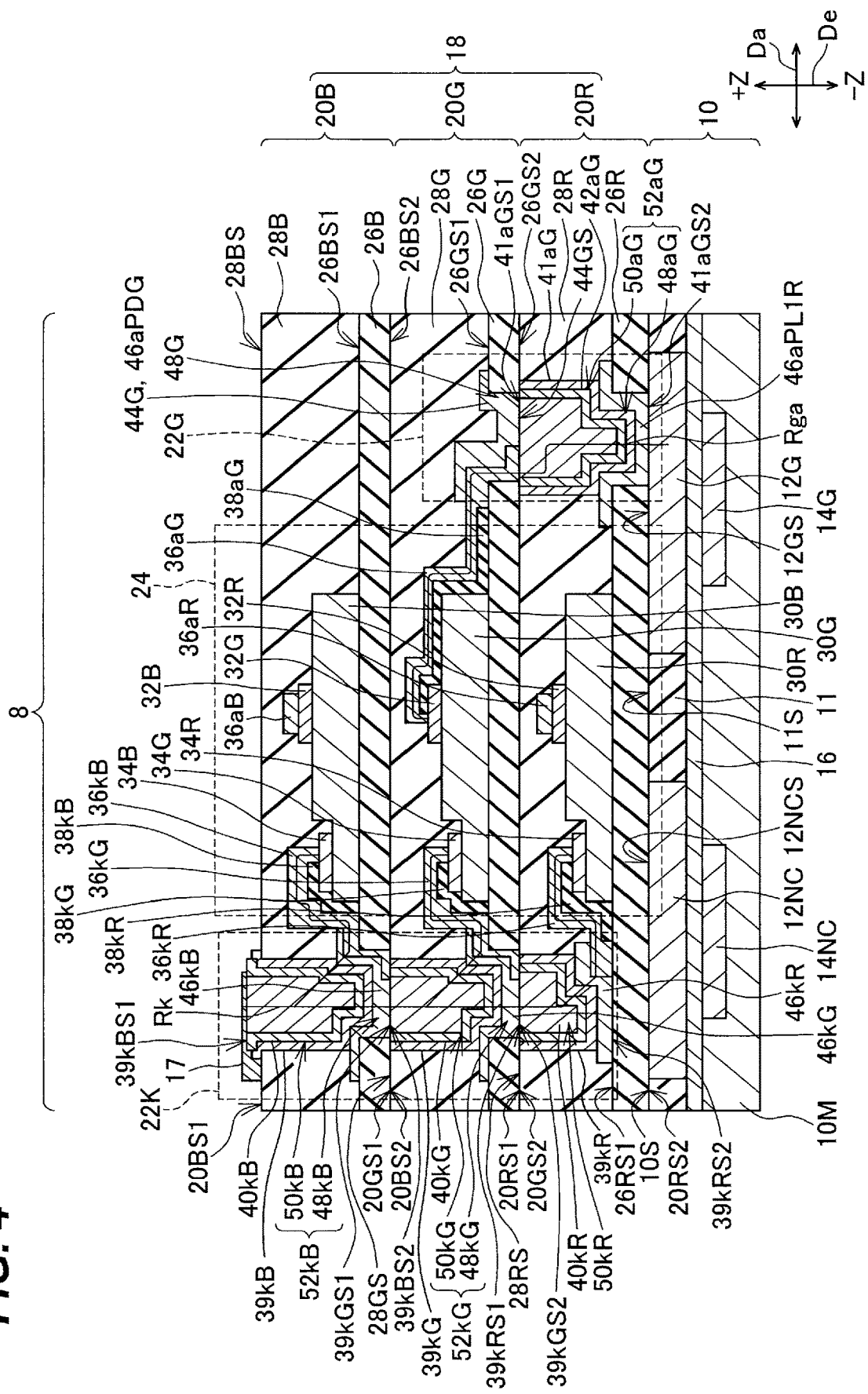
FIG. 4 illustrates a configuration of a pixel portion, and is a cross-sectional view taken along line A-A of FIG. 2.
Figure 5:
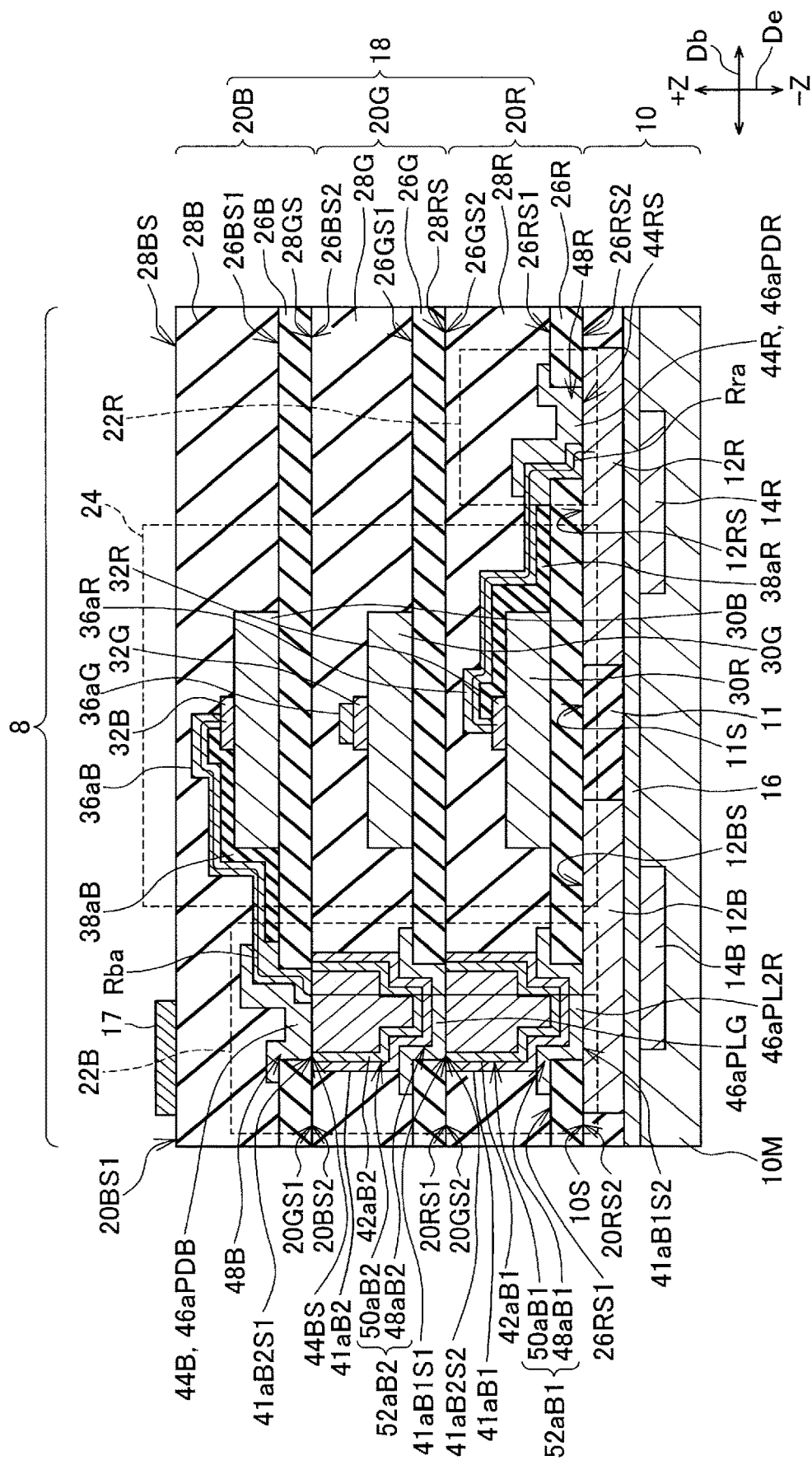
FIG. 5 illustrates the configuration of the pixel portion, and is a cross-sectional view taken along line B-B of FIG. 2.

As illustrated in FIGS. 4 and 5, the LED display portion 2 has a configuration in which a thin-film layer group 18 constituted by three thin-film layers, a first thin-film layer 20R, a second thin-film layer 20G, and a third thin-film layer 20B, is stacked on a surface (hereinafter also referred to as a substrate surface 10S) of the circuit substrate 10, which has a flat plate shape, on the +Z direction side, in a display region set in the substrate surface 10S. Hereinafter, the first thin-film layer 20R, second thin-film layer 20G, and third thin-film layer 20B may also be referred to collectively as thin-film layers 20. Each thin-film layer 20 is a film with light emitting elements arranged in a grid, and the size of each thin-film layer 20 is the same as a display size of the LED display portion 2, i.e., the size of the display region, which includes all the pixels of the LED display portion 2. Thus, in the LED display portion 2, each thin-film layer 20 is not separated for each pixel, but instead has the same size as the entire display region and covers the entire display region.

The heat dissipator 3 (see FIG. 1) is formed by a metal material, such as aluminum, having relatively high thermal conductivity to generally have a flat rectangular parallelepiped shape. The heat dissipator 3 is disposed in contact with the LED display portion 2 on the −Z direction side of the LED display portion 2, i.e., on a side opposite a surface on which an image or the like is displayed. The connection cable 4 is electrically connected to a predetermined control device (not illustrated) through the connection terminal portion 5, and transmits an image signal supplied from the control device and supplies it to the driver 6.

The driver 6 is, for example, mounted on a surface of the circuit substrate 10, and is electrically connected to each of the connection cable 4 and LED display portion 2. The driver 6 generates drive signals for respective colors of red, green, and blue on the basis of, for example, the image signal supplied through the connection cable 4, and supplies the LED display portion 2 with drive currents based on the drive signals. Thus, the LED display device 1 displays an image based on the image signal supplied from the control device (not illustrated) or the like, in the display region of the LED display portion 2.

Hereinafter, a pixel portion 8 that is a portion corresponding to one pixel of the circuit substrate 10 and thin-film layer group 18 of the LED display portion 2 will be described. Also, hereinafter, reference characters for elements pertaining to cathode terminals have a suffix "K", reference characters for elements pertaining to a thin-film LED 30R of the first thin-film layer 20R have a suffix "R", reference characters for elements pertaining to a thin-film LED 30G of the second thin-film layer 20G have a suffix "G", and reference characters for elements pertaining to a thin-film LED 30B of the third thin-film layer 20B have a suffix "B". A direction (or the Z direction) perpendicular to upper surfaces (or light emitting surfaces) that are surfaces of the thin-film LEDs 30R, 30G, and 30B on the +Z direction side may also be referred to as a light emitting direction De. A direction (or the Z direction) in which the first thin-film layer 20R, second thin-film layer 20G, and third thin-film layer 20B are stacked may also be referred to as a stacking direction. The left-right direction on the drawing sheet of FIG. 4, which is a direction along a cross-section taken along line A-A of FIG. 2, may also be referred to as an AA cross-section direction Da. The left-right direction on the drawing sheet of FIG. 5, which is a direction along a cross-section taken along line B-B of FIG. 2, may also be referred to as a BB cross-section direction Db.

<1-3. Configuration of Circuit Substrate>

Figure 3:
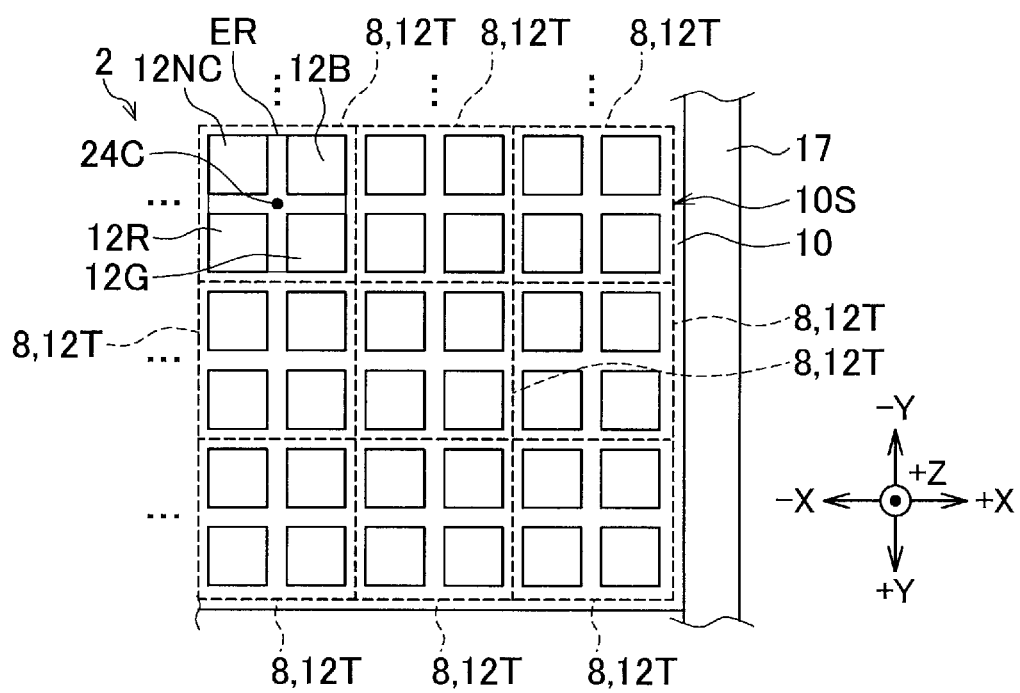
FIG. 3 illustrates a configuration of a circuit substrate, and is an enlarged plan view obtained by omitting a thin-film layer group from FIG. 2.

As illustrated in FIGS. 3, 4, and 5, the circuit substrate 10 is a complementary metal oxide semiconductor (CMOS) backplane circuit board manufactured by a silicon process. The circuit substrate 10 includes a substrate 10M, an insulating layer 11, connection pads 12R, 12G, 12B, and 12NC, active elements 14R, 14G, 14B, and 14NC, and a wiring layer 16.

The substrate 10M is a silicon wafer. The insulating layer 11 has sufficient insulating property, and is disposed to cover the wiring layer 16 from the +Z direction side.

The connection pads 12R, 12G, 12B, and 12NC are arranged in a matrix (or grid) in the substrate surface 10S. Hereinafter, the connection pads 12R, 12G, 12B, and 12NC may also be referred to collectively as connection pads 12. The four connection pads 12R, 12G, 12B, and 12NC constitute a connection pad set 12T, corresponding to one pixel. The connection pad set 12T is disposed so that a light emitting portion center 24C that is a center of a light emitting portion 24 (see FIG. 2) is located at a central portion of the connection pad set 12T (or a center of a pixel area). Thus, the light emitting portion center 24C is located inside a circumscribed rectangle ER of the connection pads 12R, 12G, 12B, and 12NC.

The connection pad 12R, serving as a first connection pad, is formed by a conductive material, such as copper, aluminum, gold, or silver, or alloys containing them. The connection pad 12R has, for example, a square shape as viewed from the +Z direction side. The connection pad 12R is located on the −X and +Y direction side of the connection pad set 12T. The connection pad 12R is located on the −Z direction side of a vertical wiring 22R (or an anode pad 44R). A surface (or an upper surface) (hereinafter also referred to as a connection pad surface 12RS) of the connection pad 12R on the +Z direction side is exposed in the substrate surface 10S. The connection pad 12R is electrically connected to the active element 14R in the circuit substrate 10. The connection pad surface 12RS is in contact with and electrically connected to a surface (or a lower surface) (hereinafter also referred to as an anode pad surface 44RS) of the anode pad 44R on the −Z direction side in the first thin-film layer 20R.

The connection pad 12G, serving as a second connection pad, is formed in the same manner as the connection pad 12R. The connection pad 12G is located on the +X and +Y direction side of the connection pad set 12T. The connection pad 12G is located on the −Z direction side of a conductive pillar structure 41aG of a vertical wiring 22G. A surface (or an upper surface) (hereinafter also referred to as a connection pad surface 12GS) of the connection pad 12G on the +Z direction side is exposed in the substrate surface 10S. The connection pad 12G is electrically connected to the active element 14G in the circuit substrate 10. The connection pad surface 12GS is in contact with and electrically connected to a surface (or a lower surface) (hereinafter also referred to as a pillar structure lower surface 41aGS2) of the conductive pillar structure 41aG on the −Z direction side in the first thin-film layer 20R. The pillar structure lower surface 41aGS2 serves as a second exposed surface.

The connection pad 12B, serving as a third connection pad, is formed in the same manner as the connection pad 12R. The connection pad 12B is located on the +X and −Y direction side of the connection pad set 12T. The connection pad 12B is located on the −Z direction side of a conductive pillar structure 41aB1 of a vertical wiring 22B. A surface (or an upper surface) (hereinafter also referred to as a connection pad surface 12BS) of the connection pad 12B on the +Z direction side is exposed in the substrate surface 10S. The connection pad 12B is electrically connected to the active element 14B in the circuit substrate 10. The connection pad surface 12BS is in contact with and electrically connected to a surface (or a lower surface) (hereinafter also referred to as a pillar structure lower surface 41aB1S2) of the conductive pillar structure 41aB1 on the −Z direction side in the first thin-film layer 20R.

The connection pad 12NC is formed in the same manner as the connection pad 12R. The connection pad 12NC is located on the −X and −Y direction side of the connection pad set 12T. The connection pad 12NC is located on the −Z direction side of a conductive pillar structure 39kR of a vertical wiring 22K. A surface (or an upper surface) (hereinafter also referred to as a connection pad surface 12NCS) of the connection pad 12NC on the +Z direction side is exposed in the substrate surface 10S. The connection pad 12NC is electrically connected to the active element 14NC in the circuit substrate 10. However, the connection pad surface 12NCS of the connection pad 12NC is not in contact with and not electrically connected to a surface (or a lower surface) (hereinafter also referred to as a pillar structure lower surface 39kRS2) of the conductive pillar structure 39kR on the −Z direction side in the first thin-film layer 20R. As such, in this embodiment, while the connection pads 12R, 12G, and 12B are used, the connection pad 12NC is not used.

The active elements 14R, 14G, 14B, and 14NC are arranged in a matrix (or grid) inside the circuit substrate 10. Hereinafter, the active elements 14R, 14G, 14B, and 14NC may also be referred to collectively as active elements 14.

The active element 14R is constituted by two metal oxide semiconductor (MOS) transistors and one capacitor. The active element 14R is located on the −Z direction side of the connection pad 12R, and is electrically connected to wiring in the wiring layer 16. The active elements 14G, 14B, and 14NC are configured in the same manner as the active element 14R. The active elements 14G, 14B, and 14NC are located on the −Z direction side of the connection pads 12G, 12B, and 12NC, respectively, and are electrically connected to the wiring in the wiring layer 16.

Although not illustrated in detail, the wiring in the wiring layer 16 is arranged in a matrix (or grid), is electrically connected to the active elements 14 (14R, 14G, 14B, and 14NC) and connection pads 12 (12R, 12G, 12B, and 12NC) as appropriate, and is electrically connected to the driver 6.

The substrate surface 10S of the circuit substrate 10 is an extremely smooth flat surface. Specifically, in the circuit substrate 10, an insulating layer surface 11S that is an upper surface of the insulating layer 11, the connection pad surface 12RS, the connection pad surface 12GS, the connection pad surface 12BS, and the connection pad surface 12NCS are extremely smooth flat surfaces parallel to each other, and the distances (i.e., level differences) between these surfaces in the Z direction are extremely small. Thus, the insulating layer surface 11S, connection pad surface 12RS, connection pad surface 12GS, connection pad surface 12BS, and connection pad surface 12NCS are located in the same plane.

Specifically, in the circuit substrate 10, a surface roughness (also referred to as roughness or surface maximum step) Rpv of the substrate surface 10S (or each of the insulating layer surface 11S, connection pad surface 12RS, connection pad surface 12GS, connection pad surface 12BS, and connection pad surface 12NCS) is 10 nm or less.

<1-4. Configuration of Thin-Film Layer Group>

As illustrated in FIGS. 4 and 5, in the thin-film layer group 18, the three thin-film layers 20, the first thin-film layer 20R, second thin-film layer 20G, and third thin-film layer 20B, are stacked in the +Z direction. The thin-film layer group 18 is physically bonded onto the circuit substrate 10 by means of intermolecular force, and is electrically connected to the circuit substrate 10.

In the thin-film layer group 18, multiple pixels (or pixel portions 8) are arranged in a matrix in a region of the LED display portion 2. A pixel portion 8 is principally constituted by four vertical wirings 22K, 22R, 22G, and 22B (hereinafter also referred to collectively as vertical wirings 22), and one light emitting portion 24. When the pixel portion 8 is viewed in the Z direction, the four vertical wirings 22 are located at four corners, and the light emitting portion 24 is surrounded by the vertical wirings 22 and located at a center of the pixel portion 8. The vertical wirings 22 correspond to anodes and cathodes.

The vertical wiring 22K is formed by conductive material, is constituted by a conductive pillar structure 39kB, a conductive pillar structure 39kB, and the conductive pillar structure 39kR, and is disposed on the −Z direction side of a cathode common wiring 17 to extend in the Z direction. A surface of the vertical wiring 22K on the +Z direction side is connected to a surface of the cathode common wiring 17 on the −Z direction side.

The vertical wiring 22R is formed by conductive material, and is formed by the anode pad 44R. The vertical wiring 22G is formed by conductive material, and is constituted by an anode pad 44G and the conductive pillar structure 41aG. The vertical wiring 22B is formed by conductive material, and is constituted by an anode pad 44B, a conductive pillar structure 41aB2, and the conductive pillar structure 41aB1.

The light emitting portion 24 is constituted by the thin-film LEDs 30R, 30G, and 30B, which overlap as viewed in the Z direction (or light emitting direction De). In this embodiment, the thin-film LEDs 30R, 30G, and 30B are stacked in the Z direction so that their centers coincide and their outlines coincide as viewed in the Z direction. However, it is not mandatory that the thin-film LEDs 30R, 30G, and 30B be stacked in the Z direction so that their centers coincide, and it is sufficient that the thin-film LEDs 30R, 30G, and 30B at least partially overlap as viewed in the Z direction. Hereinafter, the thin-film LEDs 30R, 30G, and 30B may be referred to collectively as thin-film LEDs 30.

The thin-film LEDs 30 may be formed by any suitable materials. In this embodiment, the thin-film LEDs 30R and 30G are formed by different materials. For example, one of the thin-film LEDs 30R and 30G is formed by III-V compound semiconductor material, and the other of the thin-film LEDs 30R and 30G is formed by GaN-based material.

The cathode common wiring 17 is disposed on a surface of the thin-film layer group 18 on the +Z direction side (i.e., a surface of the third thin-film layer 20B on the +Z direction side). The cathode common wiring 17 (see FIGS. 2 and 3) includes wirings linearly arranged in the X and Y directions outside a region of the LED display portion 2, and wirings linearly arranged in the X direction between light emitting portion rows that are each constituted by multiple light emitting portions 24 arranged in the X direction and that are arranged in the Y direction. Also, the cathode common wiring 17 extends to the substrate surface 10S and terminates at a common cathode connection terminal of the driver 6.

<1-4-1. Configuration of First Thin-Film Layer>

Figure 6:
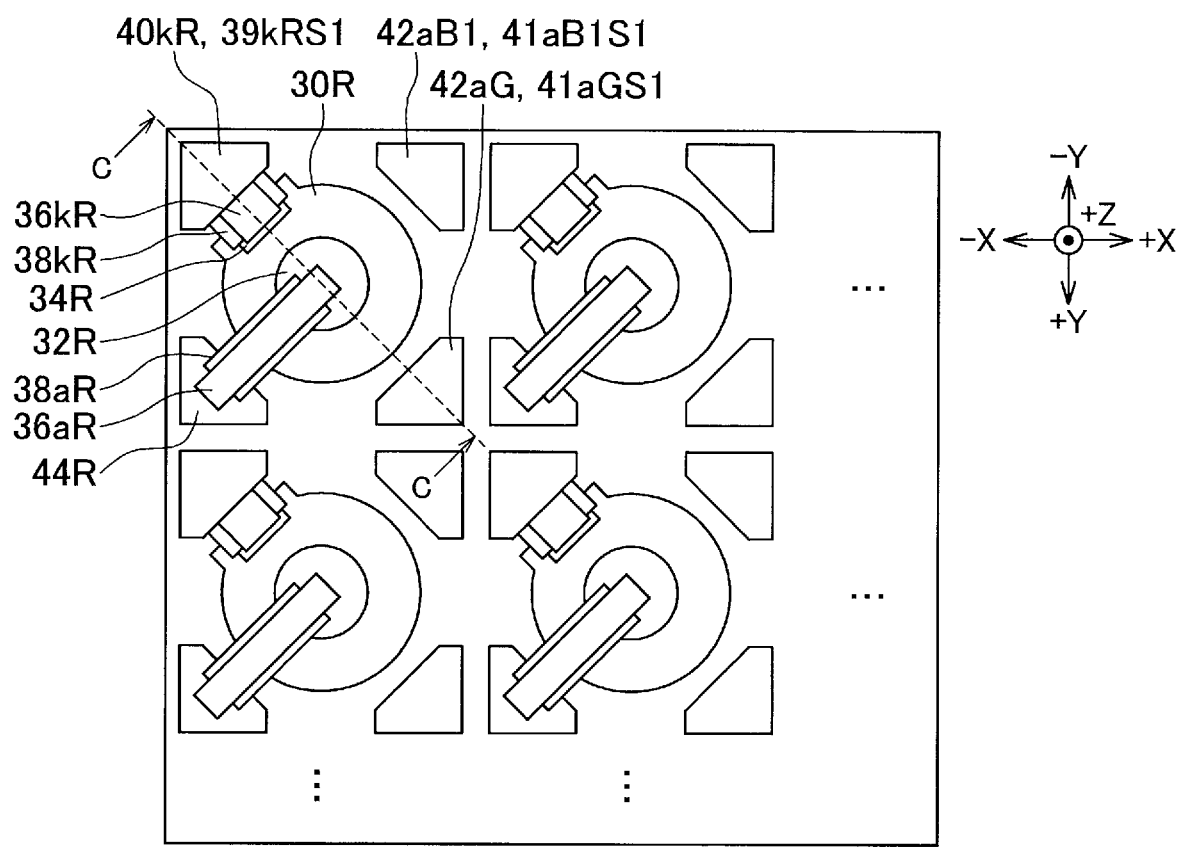
FIG. 6 is a plan view illustrating a configuration of a first thin-film layer.

As illustrated in FIGS. 4, 5, and 6, the first thin-film layer 20R is constituted by a base transparent insulating material 26R, a transparent insulating material 28R, the thin-film LED 30R, an anode electrode 32R, a cathode electrode 34R, lead-out wirings 36aR and 36kR, interlayer insulating films 38aR and 38kR, the anode pad 44R, and the conductive pillar structures 41aG, 41aB1, and 39kR.

The base transparent insulating material 26R, serving as a second insulating material, is formed by, for example, $SiO_2$, SiN, transparent polyimide, or the like, and has sufficient insulating property. In the AA cross-section direction Da (see FIG. 4), although the base transparent insulating material 26R extends from one end to the other end of the pixel portion 8, a base transparent insulating material opening 48aG serving as a first insulating layer opening is formed in the base transparent insulating material 26R at a position facing the connection pad 12G of the circuit substrate 10 in the Z direction. The base transparent insulating material opening 48aG passes through the base transparent insulating material 26R in the Z direction (or light emitting direction De) from a surface (or upper surface) (hereinafter also referred to as a base transparent insulating material upper surface 26RS1) of the base transparent insulating material 26R on the +Z direction side to a surface (or lower surface) (hereinafter also referred to as a base transparent insulating material lower surface 26RS2) of the base transparent insulating material 26R on the −Z direction side.

In the BB cross-section direction Db (see FIG. 5), although the base transparent insulating material 26R extends from one end to the other end of the pixel portion 8, base transparent insulating material openings 48aB1 and 48R serving as first insulating layer openings are formed in the base transparent insulating material 26R at positions facing the connection pads 12B and 12R of the circuit substrate 10 in the Z direction, respectively. The base transparent insulating material openings 48aB1 and 48R each pass through the base transparent insulating material 26R in the Z direction (or light emitting direction De) from the base transparent insulating material upper surface 26RS1 to the base transparent insulating material lower surface 26RS2.

The thin-film LED 30R is located at a central portion of the pixel portion 8 in each of the AA cross-section direction Da and BB cross-section direction Db, and has a length within a predetermined range in each of the AA cross-section direction Da and BB cross-section direction Db. The thin-film LED 30R has a thickness of 3 μm or less in the Z direction (or light emitting direction De). The thin-film LED 30R is a thin-film inorganic light emitting element embedded in the transparent insulating material 28R. The light emitting surface, which is the upper surface on the +Z direction side, of the thin-film LED 30R is a flat surface along the X and Y directions. The thin-film LED 30R is a quaternary LED that emits red light and that is formed by, for example, III-V compound semiconductor material containing, as constituent elements, aluminum, gallium, indium, phosphorus, arsenic, or the like. The anode electrode 32R is disposed on an anode formed at a central portion of the +Z direction side of the thin-film LED 30R. The cathode electrode 34R is disposed on a cathode formed on the −X and −Y direction side of the +Z direction side of the thin-film LED 30R.

The lead-out wiring 36aR (see FIG. 5) is formed by a conductive material, such as copper, aluminum, gold, or silver, or alloys containing them, or a transparent electrode made of indium tin oxide, zinc oxide, or the like. The lead-out wiring 36aR is in contact with both a surface (or upper surface) of the anode electrode 32R on the +Z direction side and the anode pad 44R, and electrically connects them. The interlayer insulating film 38aR is formed by an insulating material using, for example, an oxide or nitride of silicon or the like, or a resin material such as polyimide. The interlayer insulating film 38aR is disposed between the lead-out wiring 36aR and the thin-film LED 30R, and is wider than the lead-out wiring 36aR as viewed in the Z direction. The interlayer insulating film 38aR prevents unwanted short-circuiting between the lead-out wiring 36aR and the thin-film LED 30R.

The lead-out wiring 36kR (see FIG. 4) is formed by a conductive material in the same manner as the lead-out wiring 36aR (see FIG. 5), and, for example, is formed by the same material as the lead-out wiring 36aR. The lead-out wiring 36kR is in contact with both a surface (or upper surface) of the cathode electrode 34R on the +Z direction side and the conductive pillar structure 39kR, and electrically connects them. The interlayer insulating film 38kR is formed by an insulating material in the same manner as the interlayer insulating film 38aR (see FIG. 5), and, for example, is formed by the same material as the interlayer insulating film 38aR. The interlayer insulating film 38kR is disposed between the lead-out wiring 36kR and the thin-film LED 30R, and is wider than the lead-out wiring 36kR as viewed in the Z direction. The interlayer insulating film 38kR prevents unwanted short-circuiting between the lead-out wiring 36kR and the thin-film LED 30R.

The anode electrode 32R, cathode electrode 34R, lead-out wirings 36aR and 36kR, and interlayer insulating films 38aR and 38kR are preferably transparent to wavelengths of light emitted by the thin-film LED 30R.

The conductive pillar structure 41aG (see FIG. 4) is formed by conductive material, such as gold, copper, or titanium, is disposed at a position facing the connection pad 12G of the circuit substrate 10 in the Z direction, and forms part of the vertical wiring 22G. The conductive pillar structure 41aG, serving as an electrode, is constituted by an anode pillar 42aG and a contact metal layer 46aPL1R. Specifically, the anode pillar 42aG is formed on (or on the +Z direction side of) and integrally with the contact metal layer 46aPL1R, which is for process stabilization and made of gold-based metal. The anode pillar 42aG is constituted by a barrier layer that is a film for preventing diffusion of coper, is formed on the contact metal layer 46aPL1R, and is made of titanium; a seed metal layer that is formed on the barrier layer and is made of copper; and a plated portion that is made of copper and is grown and deposited on the seed metal layer. The same applies to the conductive pillar structures 41aB1 and 39kR to be described later. The conductive pillar structure 41aB1 is constituted by an anode pillar 42aB1 and a contact metal layer 46aPL2R. The anode pillar 42aB1 (see FIG. 5) is formed on (or on the +Z direction side of) and integrally with the contact metal layer 46aPL2R. The conductive pillar structure 39kR is constituted by a cathode pillar 40kR and a contact metal layer 46kR. The cathode pillar 40kR (see FIG. 4) is formed on (or on the +Z direction side of) and integrally with the contact metal layer 46kR. A surface (hereinafter also referred to as a pillar structure upper surface 41aGS1) of the conductive pillar structure 41aG on the +Z direction side is exposed from the transparent insulating material 28R. The pillar structure upper surface 41aGS1 serves as a first exposed surface. The surface (i.e., pillar structure lower surface 41aGS2) of the conductive pillar structure 41aG on the −Z direction side is exposed from the base transparent insulating material 26R.

The conductive pillar structure 41aB1 (see FIG. 5) is formed by conductive material as with the conductive pillar structure 41aG, is disposed at a position facing the connection pad 12B of the circuit substrate 10 in the Z direction, and forms part of the vertical wiring 22B. A surface (hereinafter also referred to as a pillar structure upper surface 41aB1S1) of the conductive pillar structure 41aB1 on the +Z direction side is exposed from the transparent insulating material 28R. The surface (i.e., pillar structure lower surface 41aB1S2) of the conductive pillar structure 41aB1 on the −Z direction side is exposed from the base transparent insulating material 26R.

The anode pad 44R (see FIG. 5), serving as an electric conductor, is formed by conductive material as with the conductive pillar structure 41aG, is disposed at a position facing the connection pad 12R of the circuit substrate 10 in the Z direction, and forms the vertical wiring 22R. The surface (i.e., anode pad surface 44RS) of the anode pad 44R on the −Z direction side is exposed from the base transparent insulating material 26R.

The conductive pillar structure 39kR (see FIG. 4) is formed by conductive material as with the conductive pillar structure 41aG, is disposed at a position facing the connection pad 12NC of the circuit substrate 10 in the Z direction, with the base transparent insulating material 26R between the conductive pillar structure 39kR and the connection pad 12NC, and forms part of the vertical wiring 22K. A surface (hereinafter also referred to as a pillar structure upper surface 39kRS1) of the conductive pillar structure 39kR on the +Z direction side is exposed from the transparent insulating material 28R.

The transparent insulating material 28R, serving as a first insulating material, is formed by, for example, the same material as the base transparent insulating material 26R, has sufficient insulating property, and is transparent at least to wavelengths of light emitted by the thin-film LED 30R. The transparent insulating material 28R is disposed to cover the base transparent insulating material 26R, thin-film LED 30R, anode electrode 32R, cathode electrode 34R, lead-out wirings 36aR and 36kR, interlayer insulating films 38aR and 38kR, and anode pad 44R from the +Z direction side, except for the conductive pillar structures 41aG, 41aB1, and 39kR. The thin-film LED 30R, anode electrode 32R, cathode electrode 34R, lead-out wirings 36aR and 36kR, interlayer insulating films 38aR and 38kR, and anode pad 44R are embedded in between the transparent insulating material 28R and the base transparent insulating material 26R.

A transparent insulating material opening 50aG serving as a second insulating layer opening is formed in the transparent insulating material 28R (see FIG. 4) on the +Z direction side of the base transparent insulating material opening 48aG. The transparent insulating material opening 50aG passes through the transparent insulating material 28R in the Z direction (or light emitting direction De) from a surface (or upper surface) (hereinafter also referred to as a transparent insulating material surface 28RS) of the transparent insulating material 28R on the +Z direction side to a surface (or lower surface) of the transparent insulating material 28R on the −Z direction side (or to an end of the base transparent insulating material opening 48aG on the +Z direction side).

A transparent insulating material opening 50aB1 serving as an insulating material opening is formed in the transparent insulating material 28R (see FIG. 5) on the +Z direction side of the base transparent insulating material opening 48aB1. The transparent insulating material opening 50aB1 passes through the transparent insulating material 28R in the Z direction (or light emitting direction De) from the transparent insulating material surface 28RS to the surface (or lower surface) of the transparent insulating material 28R on the −Z direction side (or to an end of the base transparent insulating material opening 48aB1 on the +Z direction side).

A transparent insulating material opening 50kR serving as a second insulating layer opening is formed in the transparent insulating material 28R (see FIG. 4) at a position facing the connection pad 12NC of the circuit substrate 10 in the Z direction, with the base transparent insulating material 26R between the transparent insulating material opening 50kR and the connection pad 12NC. The transparent insulating material opening 50kR passes through the transparent insulating material 28R in the Z direction (or light emitting direction De) from the transparent insulating material surface 28RS to the surface (or lower surface) of the transparent insulating material 28R on the −Z direction side (or to the base transparent insulating material upper surface 26RS1).

The base transparent insulating material opening 48aG and transparent insulating material opening 50aG form a first thin-film layer opening 52aG. The first thin-film layer opening 52aG is formed from an upper surface (hereinafter also referred to as a first thin-film layer upper surface 20RS1) of the first thin-film layer 20R on the +Z direction side to a lower surface (hereinafter also referred to as a first thin-film layer lower surface 20RS2) of the first thin-film layer 20R on the −Z direction side. The conductive pillar structure 41aG is formed in the first thin-film layer opening 52aG. The base transparent insulating material opening 48aB1 and transparent insulating material opening 50aB1 form a first thin-film layer opening 52aB1. The first thin-film layer opening 52aB1 is formed from the first thin-film layer upper surface 20RS1 to the first thin-film layer lower surface 20RS2. The conductive pillar structure 41aB1 is formed in the first thin-film layer opening 52aB1.

The first thin-film layer upper surface 20RS1 of the first thin-film layer 20R is an extremely smooth flat surface. Specifically, in the first thin-film layer 20R, the transparent insulating material surface 28RS, and pillar structure upper surfaces 41aGS1, 41aB1S1, and 39kRS1 are extremely smooth flat surfaces parallel to each other, and the distances (i.e., level differences) between these surfaces in the Z direction are extremely small. Thus, the transparent insulating material surface 28RS and pillar structure upper surfaces 41aGS1, 41aB1S1, and 39kRS1 are located in the same plane.

Specifically, in the first thin-film layer 20R, a surface roughness Rpv of the first thin-film layer upper surface 20RS1 (or each of the transparent insulating material surface 28RS and pillar structure upper surfaces 41aGS1, 41aB1S1, and 39kRS1) is 10 nm or less.

The first thin-film layer lower surface 20RS2 of the first thin-film layer 20R is an extremely smooth flat surface. Specifically, in the first thin-film layer 20R, the base transparent insulating material lower surface 26RS2, pillar structure lower surfaces 41aGS2 and 41aB1S2, anode pad surface 44RS, and a surface (or lower surface) of the lead-out wiring 36aR on the −Z direction side are extremely smooth flat surfaces parallel to each other, and the distances (i.e., level differences) between these surfaces in the Z direction are extremely small. Thus, the base transparent insulating material lower surface 26RS2, pillar structure lower surface 41aGS2, pillar structure lower surface 41aB1S2, anode pad surface 44RS, and the lower surface of the lead-out wiring 36aR are located in the same plane.

Specifically, in the first thin-film layer 20R, a surface roughness Rpv of the first thin-film layer lower surface 20RS2 (or each of the base transparent insulating material lower surface 26RS2, pillar structure lower surface 41aGS2, pillar structure lower surface 41aB1S2, anode pad surface 44RS, and the loser surface of the lead-out wiring 36aR) is 10 nm or less.

<1-4-2. Configuration of Second Thin-Film Layer>

Figure 7:
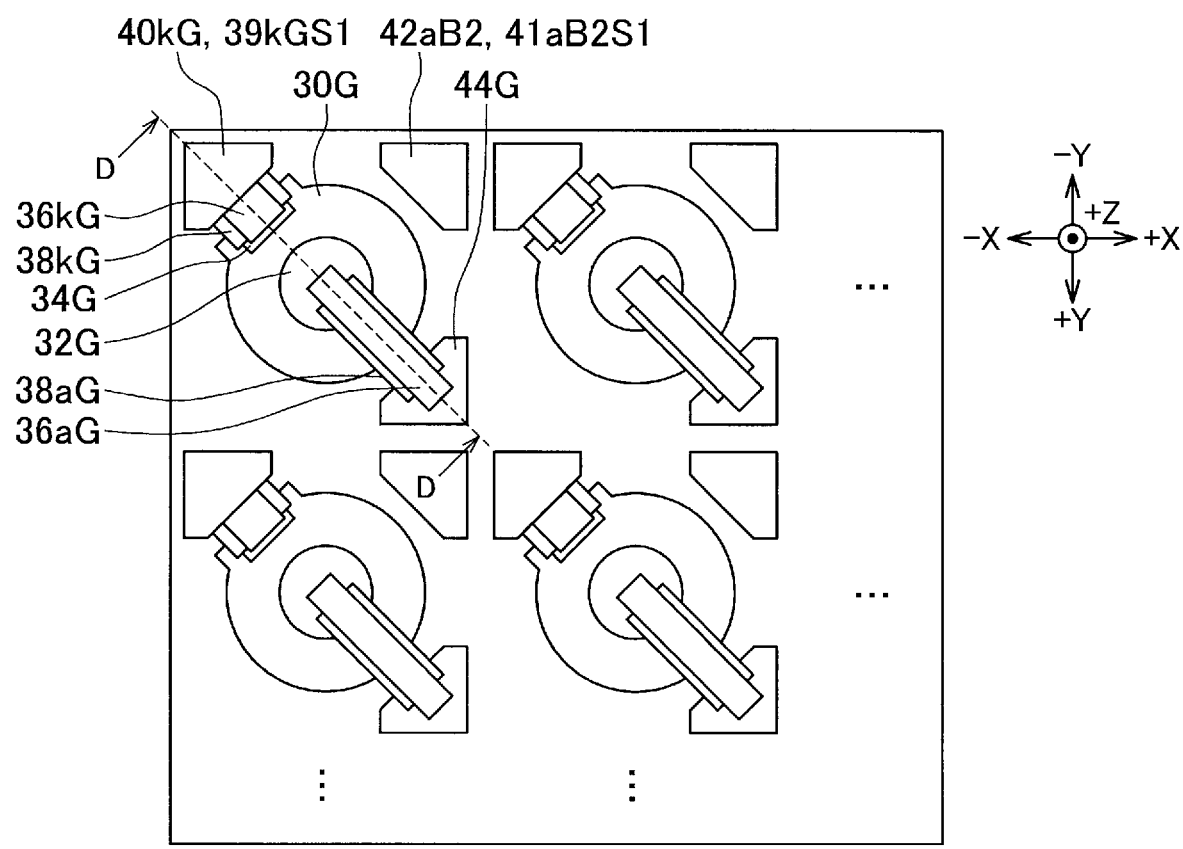
FIG. 7 is a plan view illustrating a configuration of a second thin-film layer.

As illustrated in FIGS. 4, 5, and 7, the second thin-film layer 20G is constituted by a base transparent insulating material 26G, a transparent insulating material 28G, the thin-film LED 30G, an anode electrode 32G, a cathode electrode 34G, lead-out wirings 36aG and 36kG, interlayer insulating films 38aG and 38kG, the conductive pillar structure 41aB2, the anode pad 44G, and the conductive pillar structure 39kB.

The base transparent insulating material 26G is formed by the same material as the base transparent insulating material 26R, has sufficient insulating property, and is transparent at least to wavelengths of light emitted by the thin-film LED 30R. In the AA cross-section direction Da (see FIG. 4), although the base transparent insulating material 26G extends from one end to the other end of the pixel portion 8, base transparent insulating material openings 48G and 48kG serving as first insulating layer openings are formed in the base transparent insulating material 26G at positions facing the first thin-film layer openings 52aG and 50kR of the first thin-film layer 20R in the Z direction, respectively. The base transparent insulating material openings 48G and 48kG each pass through the base transparent insulating material 26G in the Z direction (or light emitting direction De) from a surface (or upper surface) (hereinafter also referred to as a base transparent insulating material upper surface 26GS1) of the base transparent insulating material 26G on the +Z direction side to a surface (or lower surface) (hereinafter also referred to as a base transparent insulating material lower surface 26GS2) of the base transparent insulating material 26G on the −Z direction side.

In the BB cross-section direction Db (see FIG. 5), although the base transparent insulating material 26G extends from one end to the other end of the pixel portion 8, a base transparent insulating material opening 48aB2 serving as a first insulating layer opening is formed in the base transparent insulating material 26G at a position facing the first thin-film layer opening 52aB1 of the first thin-film layer 20R in the Z direction. The base transparent insulating material opening 48aB2 passes through the base transparent insulating material 26G in the Z direction (or light emitting direction De) from the base transparent insulating material upper surface 26GS1 to the base transparent insulating material lower surface 26GS2.

The thin-film LED 30G is located at a central portion of the pixel portion 8 in each of the AA cross-section direction Da and BB cross-section direction Db, and has a length within a predetermined range in each of the AA cross-section direction Da and BB cross-section direction Db. The thin-film LED 30G has a thickness of 3 μm or less in the Z direction (or light emitting direction De). The thin-film LED 30G is a thin-film inorganic light emitting element embedded in the transparent insulating material 28G. The light emitting surface, which is the upper surface on the +Z direction side, of the thin-film LED 30G is a flat surface along the X and Y directions. The thin-film LED 30G is an LED that emits green light and that is formed by, for example, GaN-based material. The anode electrode 32G is disposed on an anode formed at a central portion of the +Z direction side of the thin-film LED 30G. The cathode electrode 34G is disposed on a cathode formed on the −X and −Y direction side of the +Z direction side of the thin-film LED 30G.

The lead-out wiring 36aG (see FIG. 4) is formed by a conductive material, such as copper, aluminum, gold, or silver, or alloys containing them, or a transparent electrode made of indium tin oxide, zinc oxide, or the like. The lead-out wiring 36aG is in contact with both a surface (or upper surface) of the anode electrode 32G on the +Z direction side and the anode pad 44G, and electrically connects them. The interlayer insulating film 38aG is formed by an insulating material using, for example, an oxide or nitride of silicon or the like, or a resin material such as polyimide. The interlayer insulating film 38aG is disposed between the lead-out wiring 36aG and the thin-film LED 30G, and is wider than the lead-out wiring 36aG as viewed in the Z direction. The interlayer insulating film 38aG prevents unwanted short-circuiting between the lead-out wiring 36aG and the thin-film LED 30G.

The lead-out wiring 36kG (see FIG. 4) is formed by a conductive material in the same manner as the lead-out wiring 36aG, and, for example, is formed by the same material as the lead-out wiring 36aG. The lead-out wiring 36kG is in contact with both a surface (or upper surface) of the cathode electrode 34G on the +Z direction side and the conductive pillar structure 39kB, and electrically connects them. The interlayer insulating film 38kG is formed by an insulating material in the same manner as the interlayer insulating film 38aG, and, for example, is formed by the same material as the interlayer insulating film 38aG. The interlayer insulating film 38kG is disposed between the lead-out wiring 36kG and the thin-film LED 30G, and is wider than the lead-out wiring 36kG as viewed in the Z direction. The interlayer insulating film 38kG prevents unwanted short-circuiting between the lead-out wiring 36kG and the thin-film LED 30G.

The anode electrode 32G, cathode electrode 34G, lead-out wirings 36aG and 36kG, and interlayer insulating films 38aG and 38kG are preferably transparent to wavelengths of light emitted by the thin-film LEDs 30R and 30G.

The conductive pillar structure 41aB2 (see FIG. 5) is formed by conductive material, such as gold, copper, or titanium, is disposed at a position facing the conductive pillar structure 41aB1 of the first thin-film layer 20R in the Z direction, and forms part of the vertical wiring 22B.

The conductive pillar structure 41aB2 is constituted by an anode pillar 42aB2 and a contact metal layer 46aPLG. Specifically, the anode pillar 42aB2 is formed on (or on the +Z direction side of) and integrally with the contact metal layer 46aPLG, which is for process stabilization and made of gold-based metal. The anode pillar 42aB2 is constituted by a barrier layer that is a film for preventing diffusion of coper, is formed on the contact metal layer 46aPLG, and is made of titanium; a seed metal layer that is formed on the barrier layer and is made of copper; and a plated portion that is made of copper and is grown and deposited on the seed metal layer. The same applies to the conductive pillar structure 39kB to be described later. The conductive pillar structure 39kB is constituted by a cathode pillar 40kG and a contact metal layer 46kG. The cathode pillar 40kG (see FIG. 4) is formed on (or on the +Z direction side of) and integrally with the contact metal layer 46kG. A surface (hereinafter also referred to as a pillar structure upper surface 41aB2S1) of the conductive pillar structure 41aB2 on the +Z direction side is exposed from the transparent insulating material 28G. A surface (hereinafter also referred to as a pillar structure lower surface 41aB2S2) of the conductive pillar structure 41aB2 on the −Z direction side is exposed from the base transparent insulating material 26G.

The anode pad 44G (see FIG. 4) is formed by conductive material as with the conductive pillar structure 41aB2, is disposed at a position facing the conductive pillar structure 41aG of the first thin-film layer 20R in the Z direction, and forms part of the vertical wiring 22G. A surface (hereinafter also referred to as an anode pad surface 44GS) of the anode pad 44G on the −Z direction side is exposed from the base transparent insulating material 26G.

The conductive pillar structure 39kB (see FIG. 4) is formed by conductive material as with the conductive pillar structure 41aB2, is disposed at a position facing the conductive pillar structure 39kR of the first thin-film layer 20R in the Z direction, and forms part of the vertical wiring 22K. A surface (hereinafter also referred to as a pillar structure upper surface 39kBS1) of the conductive pillar structure 39kB on the +Z direction side is exposed from the transparent insulating material 28G. A surface (hereinafter also referred to as a pillar structure lower surface 39kBS2) of the conductive pillar structure 39kB on the −Z direction side is exposed from the base transparent insulating material 26G.

The transparent insulating material 28G is formed by, for example, the same material as the base transparent insulating material 26G, has sufficient insulating property, and is transparent at least to wavelengths of light emitted by the thin-film LEDs 30R and 30G. The transparent insulating material 28G is disposed to cover the base transparent insulating material 26G, thin-film LED 30G, anode electrode 32G, cathode electrode 34G, lead-out wirings 36aG and 36kG, interlayer insulating films 38aG and 38kG, and anode pad 44G from the +Z direction side, except for the conductive pillar structures 41aB2 and 39kB. The thin-film LED 30G, anode electrode 32G, cathode electrode 34G, lead-out wirings 36aG and 36kG, interlayer insulating films 38aG and 38kG, and anode pad 44G are embedded in between the transparent insulating material 28G and the base transparent insulating material 26G.

A transparent insulating material opening 50aB2 serving as a second insulating layer opening is formed in the transparent insulating material 28G (see FIG. 5) on the +Z direction side of the base transparent insulating material opening 48aB2. The transparent insulating material opening 50aB2 passes through the transparent insulating material 28G in the Z direction (or light emitting direction De) from a surface (or upper surface) (hereinafter also referred to as a transparent insulating material surface 28GS) of the transparent insulating material 28G on the +Z direction side to a surface (or lower surface) of the transparent insulating material 28G on the −Z direction side (or to an end of the base transparent insulating material opening 48aB2 on the +Z direction side).

A transparent insulating material opening 50kG serving as a second insulating layer opening is formed in the transparent insulating material 28G (see FIG. 4) on the +Z direction side of the base transparent insulating material opening 48kG. The transparent insulating material opening 50kG passes through the transparent insulating material 28G in the Z direction (or light emitting direction De) from the transparent insulating material surface 28GS to the surface (or lower surface) of the transparent insulating material 28G on the −Z direction side (or to an end of the base transparent insulating material opening 48kG on the +Z direction side).

The base transparent insulating material opening 48aB2 and transparent insulating material opening 50aB2 form a second thin-film layer opening 52aB2. The second thin-film layer opening 52aB2 is formed from an upper surface (hereinafter also referred to as a second thin-film layer upper surface 20GS1) of the second thin-film layer 20G on the +Z direction side to a lower surface (hereinafter also referred to as a second thin-film layer lower surface 20GS2) of the second thin-film layer 20G on the −Z direction side. The conductive pillar structure 41aB2 is formed in the second thin-film layer opening 52aB2. The base transparent insulating material opening 48kG and transparent insulating material opening 50kG form a second thin-film layer opening 52kG. The second thin-film layer opening 52kG is formed from the second thin-film layer upper surface 20GS1 to the second thin-film layer lower surface 20GS2. The conductive pillar structure 39kB is formed in the second thin-film layer opening 52kG.

The second thin-film layer upper surface 20GS1 of the second thin-film layer 20G is an extremely smooth flat surface. Specifically, in the second thin-film layer 20G, the transparent insulating material surface 28GS, pillar structure upper surface 41aB2S1, and pillar structure upper surface 39kBS1 are extremely smooth flat surfaces parallel to each other, and the distances (i.e., level differences) between these surfaces in the Z direction are extremely small. Thus, the transparent insulating material surface 28GS, pillar structure upper surface 41aB2S1, and pillar structure upper surface 39kBS1 are located in the same plane.

Specifically, in the second thin-film layer 20G, a surface roughness Gpv of the second thin-film layer upper surface 20GS1 (or each of the transparent insulating material surface 28GS, pillar structure upper surface 41aB2S1, and pillar structure upper surface 39kBS1) is 10 nm or less.

The second thin-film layer lower surface 20GS2 of the second thin-film layer 20G is an extremely smooth flat surface. Specifically, in the second thin-film layer 20G, the base transparent insulating material lower surface 26GS2, pillar structure lower surface 41aB2S2, anode pad surface 44GS, pillar structure lower surface 39kBS2, and surfaces (or lower surfaces) of the lead-out wirings 36aG and 36kG on the −Z direction side are extremely smooth flat surfaces parallel to each other, and the distances (i.e., level differences) between these surfaces in the Z direction are extremely small. Thus, the base transparent insulating material lower surface 26GS2, pillar structure lower surface 41aB2S2, anode pad surface 44GS, pillar structure lower surface 39kBS2, and the lower surfaces of the lead-out wirings 36aG and 36kG are located in the same plane.

Specifically, in the second thin-film layer 20G, a surface roughness Gpv of the second thin-film layer lower surface 20GS2 (or each of the base transparent insulating material lower surface 26GS2, pillar structure lower surface 41aB2S2, anode pad surface 44GS, pillar structure lower surface 39kBS2, and the lower surfaces of the lead-out wirings 36aG and 36kG) is 10 nm or less.

<1-4-3. Configuration of Third Thin-Film Layer>

Figure 8:
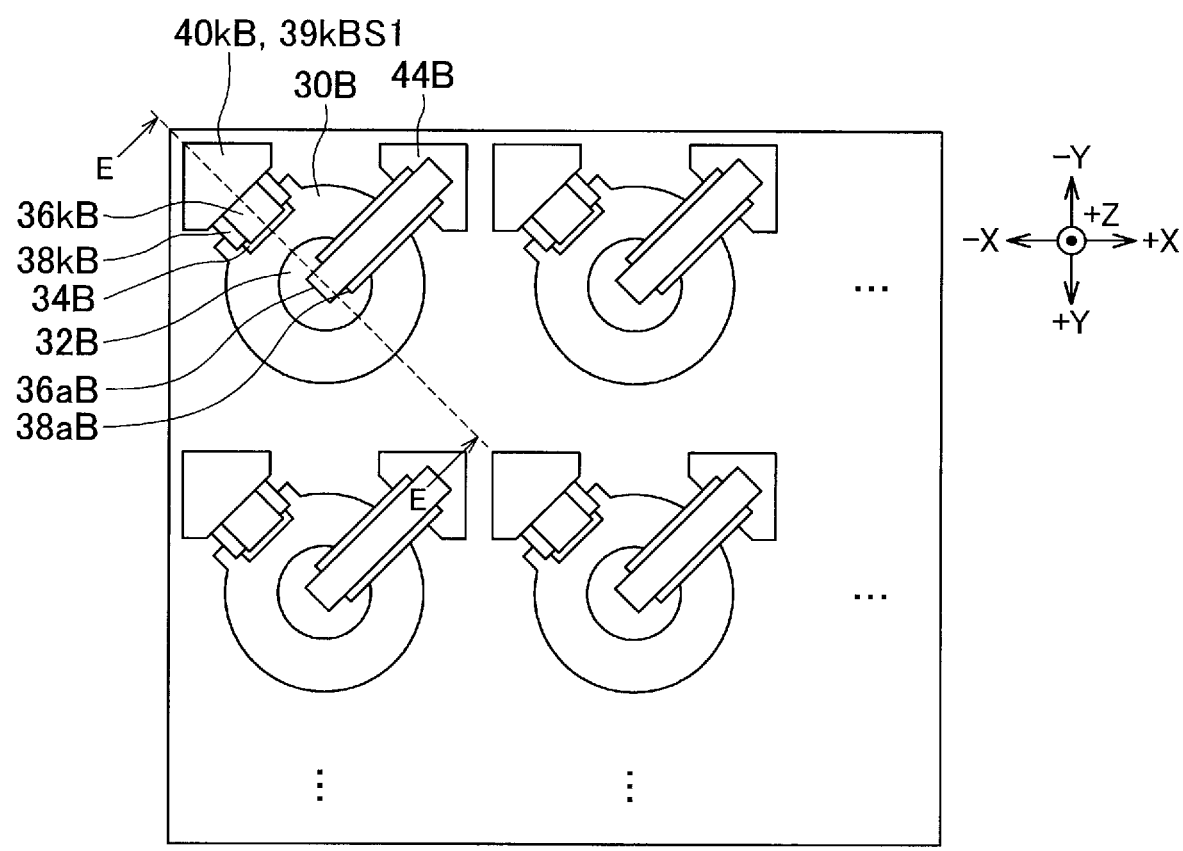
FIG. 8 is a plan view illustrating a configuration of a third thin-film layer.

As illustrated in FIGS. 4, 5, and 8, the third thin-film layer 20B is constituted by a base transparent insulating material 26B, a transparent insulating material 28B, the thin-film LED 30B, an anode electrode 32B, a cathode electrode 34B, lead-out wirings 36aB and 36kB, interlayer insulating films 38aB and 38kB, the anode pad 44B, and the conductive pillar structure 39kB.

The base transparent insulating material 26B is formed by the same material as the base transparent insulating material 26R, has sufficient insulating property, and is transparent at least to wavelengths of light emitted by the thin-film LEDs 30R and 30G. In the AA cross-section direction Da (see FIG. 4), although the base transparent insulating material 26B extends from one end to the other end of the pixel portion 8, a base transparent insulating material opening 48kB serving as a first insulating layer opening is formed in the base transparent insulating material 26B at a position facing the second thin-film layer opening 52kG of the second thin-film layer 20G in the Z direction. The base transparent insulating material opening 48kB passes through the base transparent insulating material 26B in the Z direction (light emitting direction De) from a surface (or upper surface) (hereinafter also referred to as a base transparent insulating material upper surface 26BS1) of the base transparent insulating material 26B on the +Z direction side to a surface (or lower surface) (hereinafter also referred to as a base transparent insulating material lower surface 26BS2) of the base transparent insulating material 26B on the −Z direction side.

In the BB cross-section direction Db (see FIG. 5), although the base transparent insulating material 26B extends from one end to the other end of the pixel portion 8, a base transparent insulating material opening 48B serving as a first insulating layer opening is formed in the base transparent insulating material 26B at a position facing the second thin-film layer opening 52aB2 of the second thin-film layer 20G in the Z direction. The base transparent insulating material opening 48B passes through the base transparent insulating material 26B in the Z direction (light emitting direction De) from the base transparent insulating material upper surface 26BS1 to the base transparent insulating material lower surface 26BS2.

The thin-film LED 30B, serving as a third light emitting element, is located at a central portion of the pixel portion 8 in each of the AA cross-section direction Da and BB cross-section direction Db, and has a length within a predetermined range in each of the AA cross-section direction Da and BB cross-section direction Db. The thin-film LED 30B has a thickness of 3 μm or less in the Z direction (or light emitting direction De). The thin-film LED 30B is a thin-film inorganic light emitting element embedded in the transparent insulating material 28B. The light emitting surface, which is the upper surface on the +Z direction side, of the thin-film LED 30B is a flat surface along the X and Y directions.

The thin-film LED 30B is an LED that emits blue light and that is formed by, for example, GaN-based material. The anode electrode 32B is disposed on an anode formed at a central portion of the +Z direction side of the thin-film LED 30B. The cathode electrode 34B is disposed on a cathode formed on the −X and −Y direction side of the +Z direction side of the thin-film LED 30B.

The lead-out wiring 36aB (see FIG. 5) is formed by a conductive material, such as copper, aluminum, gold, or silver, or alloys containing them, or a transparent electrode made of indium tin oxide, zinc oxide, or the like. The lead-out wiring 36aB is in contact with both a surface (or upper surface) of the anode electrode 32B on the +Z direction side and the anode pad 44B, and electrically connects them. The interlayer insulating film 38aB is formed by an insulating material using, for example, an oxide or nitride of silicon or the like, or a resin material such as polyimide. The interlayer insulating film 38aB is disposed between the lead-out wiring 36aB and the thin-film LED 30B, and is wider than the lead-out wiring 36aB as viewed in the Z direction. The interlayer insulating film 38aB prevents unwanted short-circuiting between the lead-out wiring 36aB and the thin-film LED 30B.

The lead-out wiring 36kB (see FIG. 4) is formed by a conductive material in the same manner as the lead-out wiring 36aB (see FIG. 5), and, for example, is formed by the same material as the lead-out wiring 36aB. The lead-out wiring 36kB is in contact with both a surface (or upper surface) of the cathode electrode 34B on the +Z direction side and the conductive pillar structure 39kB, and electrically connects them. The interlayer insulating film 38kB is formed by an insulating material in the same manner as the interlayer insulating film 38aB, and, for example, is formed by the same material as the interlayer insulating film 38aB.

The interlayer insulating film 38kB is disposed between the lead-out wiring 36kB and the thin-film LED 30B, and is wider than the lead-out wiring 36kB as viewed in the Z direction. The interlayer insulating film 38kB prevents unwanted short-circuiting between the lead-out wiring 36kB and the thin-film LED 30B.

The anode electrode 32B, cathode electrode 34B, lead-out wirings 36aB and 36kB, and interlayer insulating films 38aB and 38kB are preferably transparent to wavelengths of light emitted by the thin-film LEDs 30R, 30G, and 30B.

The anode pad 44B (see FIG. 5) is formed by conductive material, such as gold, copper, or titanium, is disposed at a position facing the conductive pillar structure 41aB2 of the second thin-film layer 20G in the Z direction, and forms part of the vertical wiring 22B. A surface (hereinafter also referred to as an anode pad surface 44BS) of the anode pad 44B on the −Z direction side is exposed from the base transparent insulating material 26B.

The conductive pillar structure 39kB (see FIG. 4) is formed by conductive material as with the anode pad 44B, is disposed at a position facing the conductive pillar structure 39kB of the second thin-film layer 20G in the Z direction, and forms part of the vertical wiring 22K. The conductive pillar structure 39kB is constituted by a cathode pillar 40kB and a contact metal layer 46kB. Specifically, the cathode pillar 40kB is formed on (or on the +Z direction side of) and integrally with the contact metal layer 46kB, which is for process stabilization and made of gold-based metal. The cathode pillar 40kB is constituted by a barrier layer that is a film for preventing diffusion of coper, is formed on the contact metal layer 46kB, and is made of titanium; a seed metal layer that is formed on the barrier layer and is made of copper; and a plated portion that is made of copper and is grown and deposited on the seed metal layer. A surface (hereinafter also referred to as a pillar structure upper surface 39kBS1) of the conductive pillar structure 39kB on the +Z direction side is exposed from the transparent insulating material 28B. A surface (hereinafter also referred to as a pillar structure lower surface 39kBS2) of the conductive pillar structure 39kB on the −Z direction side is exposed from the base transparent insulating material 26B.

The transparent insulating material 28B is formed by, for example, the same material as the base transparent insulating material 26B, has sufficient insulating property, and is transparent at least to wavelengths of light emitted by the thin-film LEDs 30R, 30G, and 30B. The transparent insulating material 28B is disposed to cover the base transparent insulating material 26B, thin-film LED 30B, anode electrode 32B, cathode electrode 34B, lead-out wirings 36aB and 36kB, interlayer insulating films 38aB and 38kB, and anode pad 44B from the +Z direction side, except for the conductive pillar structure 39kB. The thin-film LED 30B, anode electrode 32B, cathode electrode 34B, lead-out wirings 36aB and 36kB, interlayer insulating films 38aB and 38kB, and anode pad 44B are embedded in between the transparent insulating material 28B and the base transparent insulating material 26B.

A transparent insulating material opening 50kB serving as a second insulating layer opening is formed in the transparent insulating material 28B on the +Z direction side of the base transparent insulating material opening 48kB. The transparent insulating material opening 50kB passes through the transparent insulating material 28B in the Z direction (or light emitting direction De) from a surface (or upper surface) (hereinafter also referred to as a transparent insulating material surface 28BS) of the transparent insulating material 28B on the +Z direction side to a surface (or lower surface) of the transparent insulating material 28B on the −Z direction side (or to an end of the base transparent insulating material opening 48kB on the +Z direction side).

The base transparent insulating material opening 48kB and transparent insulating material opening 50kB form a third thin-film layer opening 52kB. The third thin-film layer opening 52kB is formed from an upper surface (hereinafter also referred to as a third thin-film layer upper surface 20BS1) of the third thin-film layer 20B on the +Z direction side to a lower surface (hereinafter also referred to as a third thin-film layer lower surface 20BS2) of the third thin-film layer 20B on the −Z direction side. The conductive pillar structure 39kB is formed in the third thin-film layer opening 52kB. An end of the conductive pillar structure 39kB on the +Z direction side slightly projects from the transparent insulating material surface 28BS in the +Z direction.

The third thin-film layer lower surface 20BS2 of the third thin-film layer 20B is an extremely smooth flat surface. Specifically, in the third thin-film layer 20B, the base transparent insulating material lower surface 26BS2, anode pad surface 44BS, pillar structure lower surface 39kBS2, and surfaces (or lower surfaces) of the lead-out wirings 36aB and 36kB on the −Z direction side are extremely smooth flat surfaces parallel to each other, and the distances (i.e., level differences) between these surfaces in the Z direction are extremely small. Thus, the base transparent insulating material lower surface 26BS2, anode pad surface 44BS, pillar structure lower surface 39kBS2, and the lower surfaces of the lead-out wirings 36aB and 36kB are located in the same plane.

Specifically, in the third thin-film layer 20B, a surface roughness Ppv of the third thin-film layer lower surface 20BS2 (or each of the base transparent insulating material lower surface 26BS2, anode pad surface 44BS, pillar structure lower surface 39kBS2, and the lower surfaces of the lead-out wirings 36aB and 36kB) is 10 nm or less.

In general, light attenuates more when passing through a material of an LED that emits light shorter in wavelength than the light. Light wavelength decreases in the order of red, green, and blue. Thus, the LED display device 1 is configured such that the thin-film LED 30R, which emits red light, which attenuates less, is disposed farthest from the +Z direction side, on which an image is displayed, and the thin-film LEDs 30G and 30B are disposed on the thin-film LED 30R in this order in the +Z direction. For example, the wavelength of light emitted by the thin-film LED 30R is 601 to 780 nm, the wavelength of light emitted by the thin-film LED 30G is 491 to 600 nm, and the wavelength of light emitted by the thin-film LED 30B is 400 to 490 nm. Thus, in this embodiment, the thin-film LEDs 30R, 30G, and 30B emit light of different wavelengths. Hereinafter, the lead-out wirings 36kR, 36aR, 36kG, 36aG, 36kB, and 36aB may also be referred to collectively as lead-out wirings 36.

<1-5. Connection Relationship between Thin-Film Layers and Circuit Substrate>
<1-5-1. Physical Connection Relationship between Circuit Substrate and Thin-Film Layers>

The substrate surface 10S of the circuit substrate 10 and the first thin-film layer lower surface 20RS2 of the first thin-film layer 20R are physically bonded together by intermolecular force. The first thin-film layer upper surface 20RS1 of the first thin-film layer 20R and the second thin-film layer lower surface 20GS2 of the second thin-film layer 20G are physically bonded together by intermolecular force. The second thin-film layer upper surface 20GS1 of the second thin-film layer 20G and the third thin-film layer lower surface 20BS2 of the third thin-film layer 20B are physically bonded together by intermolecular force.

In this manner, in the LED display portion 2, the substrate surface 10S and the first thin-film layer lower surface 20RS2, the first thin-film layer upper surface 20RS1 and the second thin-film layer lower surface 20GS2, and the second thin-film layer upper surface 20GS1 and the third thin-film layer lower surface 20BS2 are each bonded together by intermolecular force, not by metal bonding.

<1-5-2. Electrical Connection Relationship between Circuit Substrate and Thin-Film Layers>

The connection pad surface 12RS of the connection pad 12R (see FIG. 5) is physically bonded to the anode pad surface 44RS of the anode pad 44R of the first thin-film layer 20R by intermolecular force, and the connection pad 12R is electrically connected to the anode electrode 32R of the thin-film LED 30R through the anode pad 44R and lead-out wiring 36aR, as indicated by conduction path Rra.

The connection pad surface 12GS of the connection pad 12G (see FIG. 4) is physically bonded to the pillar structure lower surface 41aGS2 of the conductive pillar structure 41aG of the first thin-film layer 20R by intermolecular force. The pillar structure upper surface 41aGS1 of the conductive pillar structure 41aG is physically bonded to the anode pad surface 44GS of the anode pad 44G of the second thin-film layer 20G by intermolecular force. The anode pad 44G is physically in contact with the lead-out wiring 36aG. Thus, the connection pad 12G is electrically connected to the anode electrode 32G of the thin-film LED 30G through the conductive pillar structure 41aG, anode pad 44G, and lead-out wiring 36aG, as indicated by conduction path Rga.

The connection pad surface 12BS of the connection pad 12B (see FIG. 5) is physically bonded to the pillar structure lower surface 41aB1S2 of the conductive pillar structure 41aB1 of the first thin-film layer 20R by intermolecular force. The pillar structure upper surface 41aB1S1 of the conductive pillar structure 41aB1 is physically bonded to the pillar structure lower surface 41aB2S2 of the conductive pillar structure 41aB2 of the second thin-film layer 20G by intermolecular force. The pillar structure upper surface 41aB2S1 of the conductive pillar structure 41aB2 is physically bonded to the anode pad surface 44BS of the anode pad 44B of the third thin-film layer 20B by intermolecular force. The anode pad 44B is physically in contact with the lead-out wiring 36aB. Thus, the connection pad 12B is electrically connected to the anode electrode 32B of the thin-film LED 30B through the conductive pillar structure 41aB1, conductive pillar structure 41aB2, anode pad 44B, and lead-out wiring 36aB, as indicated by conduction path Rba.

The pillar structure upper surface 39kRS1 of the conductive pillar structure 39kR (see FIG. 4) is physically bonded to the pillar structure lower surface 39kBS2 of the conductive pillar structure 39kB of the second thin-film layer 20G by intermolecular force. The pillar structure upper surface 39kBS1 of the conductive pillar structure 39kB is physically bonded to the pillar structure lower surface 39kBS2 of the conductive pillar structure 39kB of the third thin-film layer 20B by intermolecular force. The pillar structure upper surface 39kBS1 of the conductive pillar structure 39kB is physically in contact with the cathode common wiring 17.

The conductive pillar structure 39kR is physically in contact with the lead-out wiring 36kR. Thus, the cathode electrode 34R is electrically connected to the cathode common wiring 17 through the lead-out wiring 36kR, conductive pillar structure 39kR, conductive pillar structure 39kB, and conductive pillar structure 39kB, as indicated by conduction path Rk.

The conductive pillar structure 39kB is physically in contact with the lead-out wiring 36kG. Thus, the cathode electrode 34G is electrically connected to the cathode common wiring 17 through the lead-out wiring 36kG, conductive pillar structure 39kB, and conductive pillar structure 39kB, as indicated by conduction path Rk.

The conductive pillar structure 39kB is physically in contact with the lead-out wiring 36kB. Thus, the cathode electrode 34B is electrically connected to the cathode common wiring 17 through the lead-out wiring 36kB and conductive pillar structure 39kB, as indicated by conduction path Rk. The cathode common wiring 17 is also electrically connected to the conductive pillar structures 39kB of the other pixel portions 8, and is also connected to the common cathode connection terminal (or a common terminal) of the driver 6.

<1-6. Method of Manufacturing LED Display Portion>

Next, an example of a method of manufacturing the LED display portion 2 of the LED display device 1 will be described with reference to FIGS. 9A to 9G, 10A to 10G, 11A to 11G, and 12A to 12C, which are each a schematic cross-sectional view with the +Z direction directed upward. For convenience of explanation, the +Z direction may also be referred to as an upward direction, and the -Z direction may also be referred to as a downward direction.

<1-6-1. Method of Manufacturing First Thin-Film Layer>

Figure 9A:
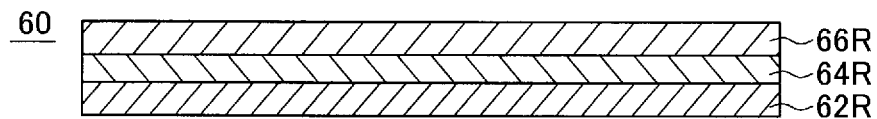
FIGS. 9A to 9G illustrate a process of manufacturing the first thin-film layer, and correspond to a cross-section taken along line C-C of FIG. 6.

A method of manufacturing the first thin-film layer 20R will be first described with reference to FIGS. 9A to 9G. First, as illustrated in FIG. 9A, a manufacturing apparatus 60 performs a process of forming a lattice-matched sacrificial layer 64R on the upper side, i.e., +Z direction side, of a predetermined LED growth substrate 62R and growing a thin-film LED layer 66R on the sacrificial layer 64R. In this embodiment, as an example, GaAs is used as the LED growth substrate 62R, and a material such as a GaAs-based material containing Al is used as the sacrificial layer 64R.

Figure 9B:
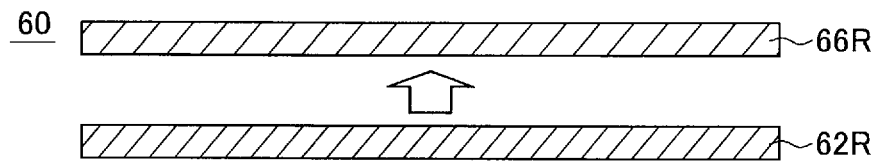

Then, as illustrated in FIG. 9B, the manufacturing apparatus 60 separates the thin-film LED layer 66R from the LED growth substrate 62R by etching and removing the sacrificial layer 64R. The separated thin-film LED layer 66R is preferably planarized by, for example, polishing the separation surface.

Figure 9C:
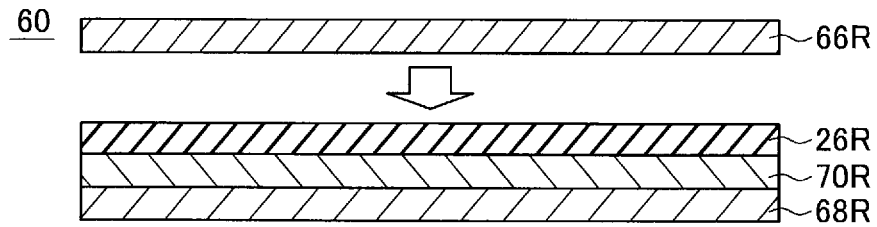

Then, as illustrated in FIG. 9C, the manufacturing apparatus 60 sequentially forms a sacrificial layer 70R and the base transparent insulating material 26R on a substrate 68R for formation of the first thin-film layer 20R, and bonds the thin-film LED layer 66R, which is a semiconductor thin film including a light emitting layer, to the base transparent insulating material 26R by means of intermolecular force. At this time, since it is required that the upper surface (or surface on the +Z direction side) of each of the sacrificial layer 70R and base transparent insulating material 26R be planarized to have a surface roughness Rpv of 10 nm or less, the manufacturing apparatus 60 may perform planarization, such as polishing.

Figure 9D:
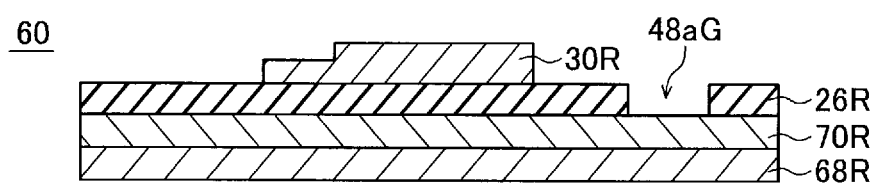

Then, as illustrated in FIG. 9D, the manufacturing apparatus 60 forms the thin-film LED 30R by etching the thin-film LED layer 66R and forms the base transparent insulating material openings 48aG, 48aB1 (see FIG. 5), and 48R (see FIG. 5) by patterning the base transparent insulating material 26R.

Figure 9E:
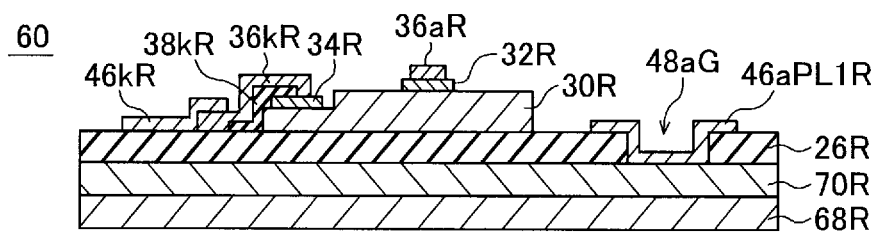

Then, as illustrated in FIG. 9E, the manufacturing apparatus 60 forms the anode electrode 32R, the cathode electrode 34R, the interlayer insulating films 38kR and 38aR (see FIG. 5), the lead-out wirings 36kR and 36aR, the contact metal layers 46aPL1R (serving as a second electric conductor), 46kR, and 46aPL2R (see FIG. 5), and a contact metal layer 46aPDR (see FIG. 5) on the thin-film LED 30R and base transparent insulating material 26R, by performing patterning using a method such as lithography or sputtering.

Figure 9F:
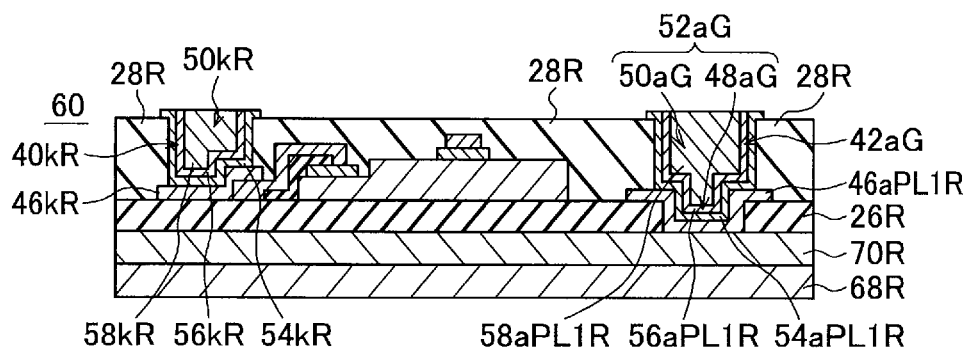

Then, as illustrated in FIG. 9F, the manufacturing apparatus 60 performs embedding with the transparent insulating material 28R (or forms the transparent insulating material 28R), forms the transparent insulating material openings 50aG, 50kR, and 50aB1 (see FIG. 5) by patterning the transparent insulating material 28R, and forms a barrier layer 54aPL1R, a barrier layer 54kR, and a barrier layer (not illustrated) in the transparent insulating material openings 50aG, 50kR, and 50aB1 (see FIG. 5), respectively, by using a method such as sputtering, vapor deposition, or electroless plating. Then, the manufacturing apparatus 60 forms a seed metal layer 56aPL1R, a seed metal layer 56kR, and a seed metal layer (not illustrated) on the barrier layer 54aPL1R, barrier layer 54kR, and barrier layer (not illustrated) in the transparent insulating material openings 50aG, 50kR, and 50aB1 (see FIG. 5), respectively, by using a method such as sputtering, vapor deposition, or electroless plating. Then, the manufacturing apparatus 60 performs plating to grow a plated portion 58aPL1R, a plated portion 58kR, and a plated portion (not illustrated), which are conductive materials, on the seed metal layer 56aPL1R, seed metal layer 56kR, and seed metal layer (not illustrated) in the transparent insulating material openings 50aG, 50kR, and 50aB1 (see FIG. 5), respectively. Thereby, the manufacturing apparatus 60 forms the anode pillar 42aG, serving as a first electric conductor, the cathode pillar 40kR, and the anode pillar 42aB1 (see FIG. 5) on the contact metal layers 46aPL1R, 46kR, and 46aPL2R (see FIG. 5), which are exposed through the transparent insulating material openings 50aG, 50kR, and 50aB1 (see FIG. 5), respectively. The contact metal layer 46aPDR (see FIG. 5) serves as the anode pad 44R.

Figure 9G:
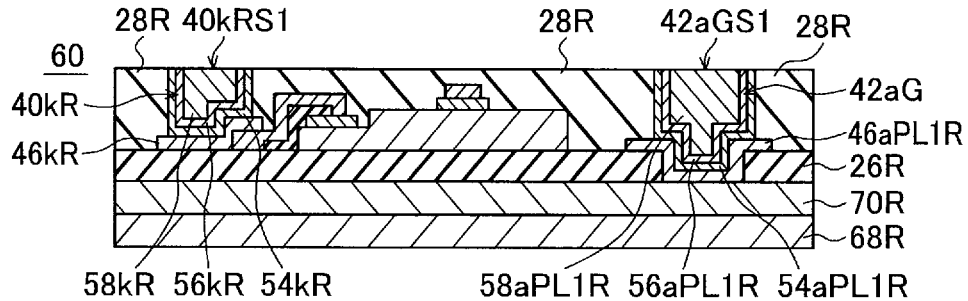

Then, as illustrated in FIG. 9G, the manufacturing apparatus 60 planarizes the upper surfaces of the transparent insulating material 28R, anode pillar 42aG, cathode pillar 40kR, and anode pillar 42aB1 (see FIG. 5) by chemical mechanical polishing (CMP) to form the pillar structure upper surfaces 41aGS1 and 41aB1S1 (see FIG. 5) on the upper surfaces of the anode pillars 42aG and 42aB1 (see FIG. 5), respectively, and form the pillar structure upper surface 39kRS1 on the upper surface of the cathode pillar 40kR such that the pillar structure upper surfaces 41aGS1, 41aB1S1, and 39kRS1 are exposed from the upper surface of the transparent insulating material 28R.

<1-6-2. Method of Manufacturing Second Thin-Film Layer>

Figure 10A:
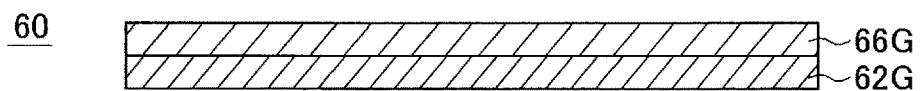
FIGS. 10A to 10G illustrate a process of manufacturing the second thin-film layer, and correspond to a cross-section taken along line D-D of FIG. 7.

Next, a method of manufacturing the second thin-film layer 20G will be described with reference to FIGS. 10A to 10G. First, as illustrated in FIG. 10A, the manufacturing apparatus 60 performs a process of growing a thin-film LED layer 66G on the upper side, i.e., +Z direction side, of a predetermined LED growth substrate 62G. In this embodiment, as an example, a sapphire substrate is used as the LED growth substrate 62G.

Figure 10B:
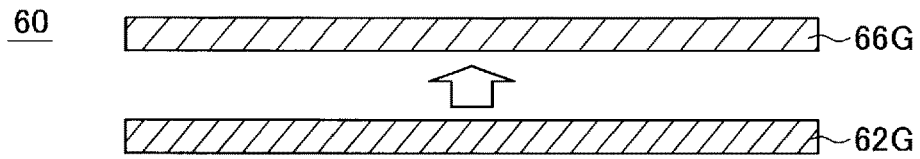

Then, as illustrated in FIG. 10B, the manufacturing apparatus 60 separates the thin-film LED layer 66G from the LED growth substrate 62G by a known laser lift-off method. The separated thin-film LED layer 66G is preferably planarized by, for example, polishing the separation surface.

Figure 10C:
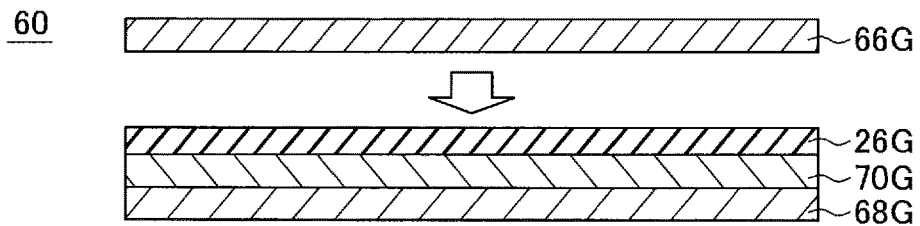

Then, as illustrated in FIG. 10C, the manufacturing apparatus 60 sequentially forms a sacrificial layer 70G and the base transparent insulating material 26G, serving as a first insulating layer, on a substrate 68G for formation of the second thin-film layer 20G, and bonds the thin-film LED layer 66G, which is a semiconductor thin film including a light emitting layer, to the base transparent insulating material 26G by means of intermolecular force. At this time, since it is required that the upper surface (or surface on the +Z direction side) of each of the sacrificial layer 70G and base transparent insulating material 26G be planarized to have a surface roughness Rpv of 10 nm or less, the manufacturing apparatus 60 may perform planarization, such as polishing.

Figure 10D:
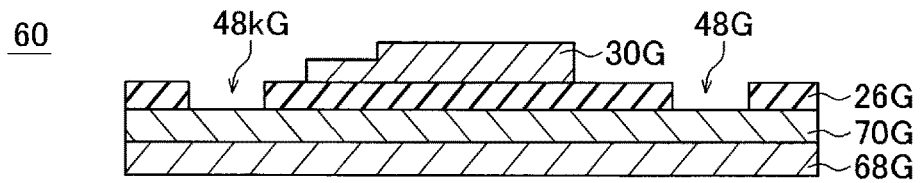

Then, as illustrated in FIG. 10D, the manufacturing apparatus 60 forms the thin-film LED 30G by etching the thin-film LED layer 66G and forms the base transparent insulating material openings 48G, 48kG, and 48aB2 (see FIG. 5) by patterning the base transparent insulating material 26G.

Figure 10E:
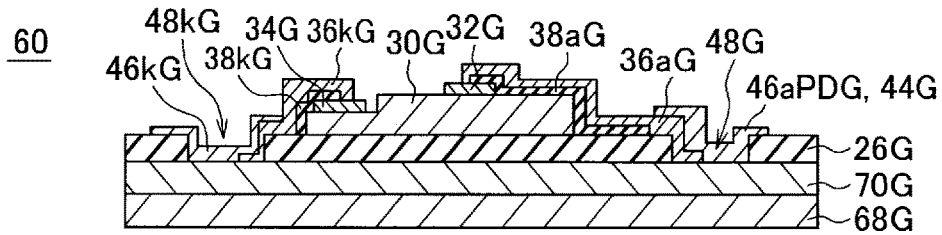

Then, as illustrated in FIG. 10E, the manufacturing apparatus 60 forms the anode electrode 32G, the cathode electrode 34G, the interlayer insulating films 38kG and 38aG, the lead-out wirings 36kG and 36aG, a contact metal layer 46aPDG, and the contact metal layers 46kG and 46aPLG (see FIG. 5), serving as conductive materials, on the thin-film LED 30G and base transparent insulating material 26G, by performing patterning using a method such as lithography or sputtering.

Figure 10F:
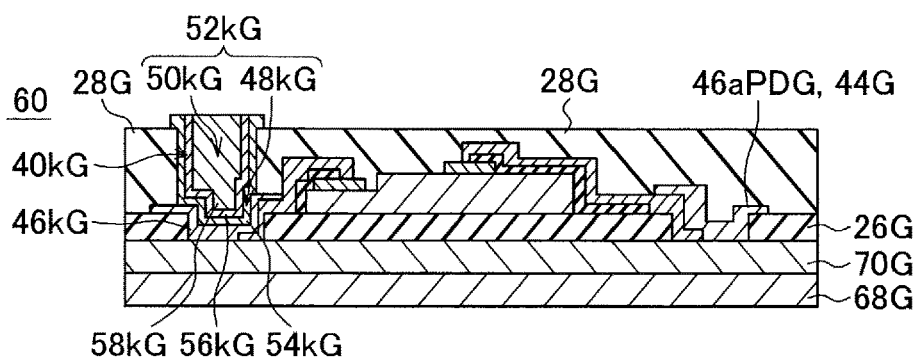

Then, as illustrated in FIG. 10F, the manufacturing apparatus 60 performs embedding with the transparent insulating material 28G, serving as a second insulating layer, (or forms the transparent insulating material 28G), forms the transparent insulating material openings 50kG and 50aB2 (see FIG. 5) by patterning the transparent insulating material 28G, and forms a barrier layer 54kG and a barrier layer (not illustrated) in the transparent insulating material openings 50kG and 50aB2 (see FIG. 5), respectively, by using a method such as sputtering, vapor deposition, or electroless plating. Then, the manufacturing apparatus 60 forms a seed metal layer 56kG and a seed metal layer (not illustrated) on the barrier layer 54kG and the barrier layer (not illustrated) in the transparent insulating material openings 50kG and 50aB2 (see FIG. 5), respectively, by using a method such as sputtering, vapor deposition, or electroless plating. Then, the manufacturing apparatus 60 performs plating to grow a plated portion 58kG and a plated portion (not illustrated), which are conductive materials, on the seed metal layer 56kG and seed metal layer (not illustrated) in the transparent insulating material openings 50kG and 50aB2 (see FIG. 5), respectively. Thereby, the manufacturing apparatus 60 forms the cathode pillar 40kG (which is a conductive material) and anode pillar 42aB2 (see FIG. 5) on the contact metal layers 46kG and 46aPLG (see FIG. 5), which are exposed through the transparent insulating material openings 50kG and 50aB2 (see FIG. 5), respectively. The contact metal layer 46aPDG (see FIG. 4) serves as the anode pad 44G.

Figure 10G:
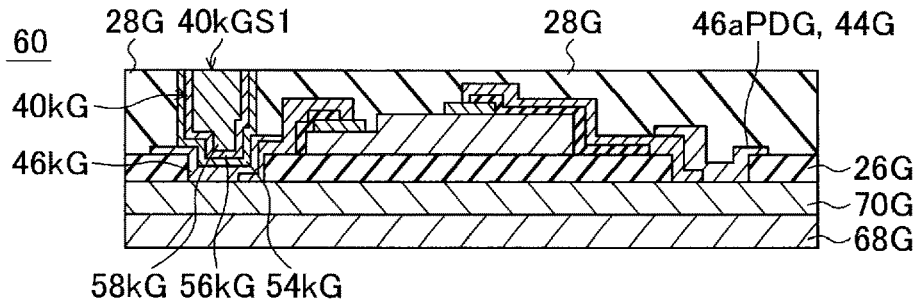

Then, as illustrated in FIG. 10G, the manufacturing apparatus 60 planarizes the upper surfaces of the transparent insulating material 28G, cathode pillar 40kG, and anode pillar 42aB2 (see FIG. 5) by chemical mechanical polishing (CMP) to form the pillar structure upper surface 39kBS1 on the upper surface of the cathode pillar 40kG, and form the pillar structure upper surface 41aB2S1 (see FIG. 5) on the upper surface of the anode pillar 42aB2 such that the pillar structure upper surfaces 39kBS1 and 41aB2S1 are exposed from the upper surface of the transparent insulating material 28G.

<1-6-3. Method of Manufacturing Third Thin-Film Layer>

Figure 11A:
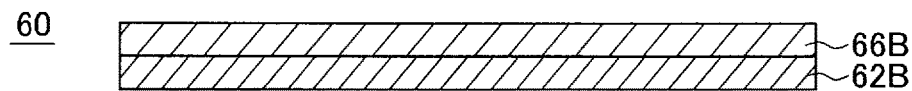
FIGS. 11A to 11G illustrate a process of manufacturing the third thin-film layer, and correspond to a cross-section taken along line E-E of FIG. 8.

Next, a method of manufacturing the third thin-film layer 20B will be described with reference to FIGS. 11A to 11G. First, as illustrated in FIG. 11A, the manufacturing apparatus 60 performs a process of growing a thin-film LED layer 66B on the upper side, i.e., +Z direction side, of a predetermined LED growth substrate 62B. In this embodiment, as an example, a sapphire substrate is used as the LED growth substrate 62B.

Figure 11B:
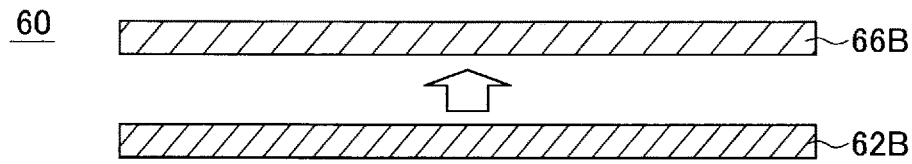

Then, as illustrated in FIG. 11B, the manufacturing apparatus 60 separates the thin-film LED layer 66B from the LED growth substrate 62B by a known laser lift-off method. The separated thin-film LED layer 66B is preferably planarized by, for example, polishing the separation surface.

Figure 11C:
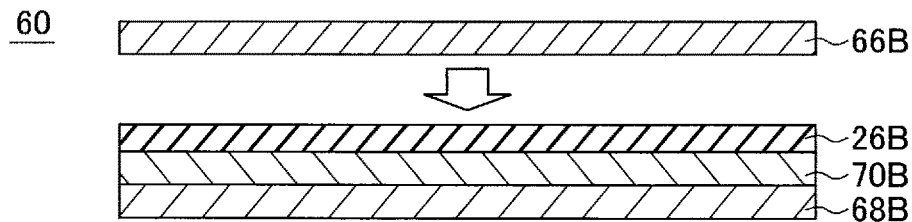

Then, as illustrated in FIG. 11C, the manufacturing apparatus 60 sequentially forms a sacrificial layer 70B and the base transparent insulating material 26B on a substrate 68B for formation of the third thin-film layer 20B, and bonds the thin-film LED layer 66B, which is a semiconductor thin film including a light emitting layer, to the base transparent insulating material 26B by means of intermolecular force. At this time, since it is required that the upper surface (or surface on the +Z direction side) of each of the sacrificial layer 70B and base transparent insulating material 26B be planarized to have a surface roughness Rpv of 10 nm or less, the manufacturing apparatus 60 may perform planarization, such as polishing.

Figure 11D:
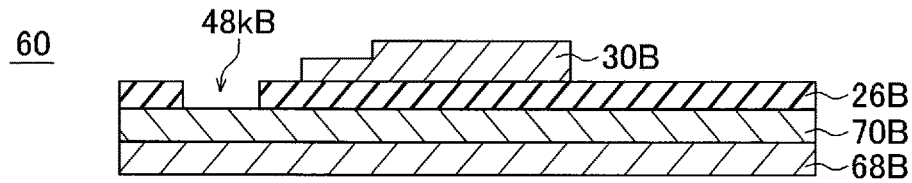

Then, as illustrated in FIG. 11D, the manufacturing apparatus 60 forms the thin-film LED 30B by etching the thin-film LED layer 66B and forms the base transparent insulating material openings 48$k$B and 48B (see FIG. 5) by patterning the base transparent insulating material 26B.

Figure 11E:
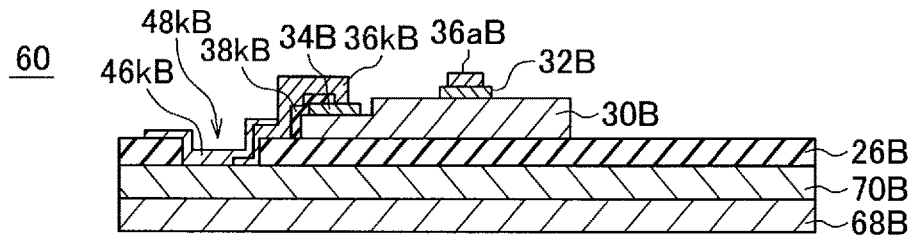

Then, as illustrated in FIG. 11E, the manufacturing apparatus 60 forms the anode electrode 32B, the cathode electrode 34B, the interlayer insulating films 38$k$B and 38$a$B (see FIG. 5), the lead-out wirings 36$k$B and 36$a$B, the contact metal layer 46$k$B, and a contact metal layer 46$a$PDB (see FIG. 5), on the thin-film LED 30B and base transparent insulating material 26B, by performing patterning using a method such as lithography or sputtering.

Figure 11F:
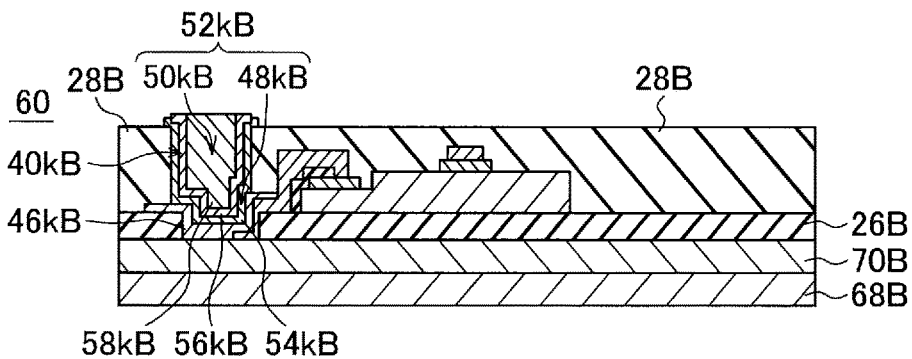
Figure 11G:
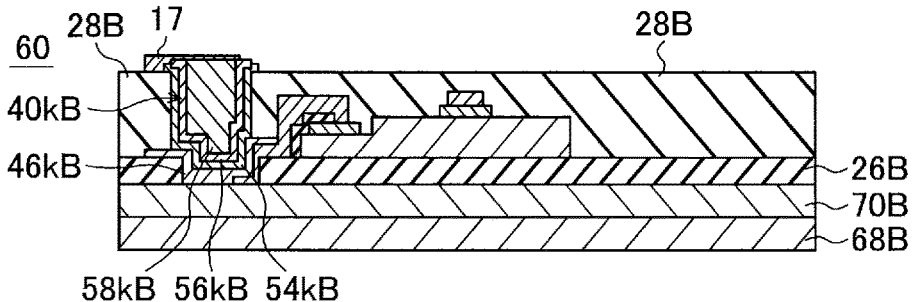

Then, as illustrated in FIG. 11F, the manufacturing apparatus 60 performs embedding with the transparent insulating material 28B (or forms the transparent insulating material 28B), forms the transparent insulating material opening 50$k$B by patterning the transparent insulating material 28B, and forms a barrier layer 54$k$B in the transparent insulating material opening 50$k$B, by using a method such as sputtering, vapor deposition, or electroless plating. Then, the manufacturing apparatus 60 forms a seed metal layer 56$k$B on the barrier layer 54$k$B in the transparent insulating material opening 50$k$B by using a method such as sputtering, vapor deposition, or electroless plating. Then, the manufacturing apparatus 60 performs plating to grow a plated portion 58$k$B, which is a conductive material, on the seed metal layer 56$k$B in the transparent insulating material opening 50$k$B. Thereby, the manufacturing apparatus 60 forms the cathode pillar 40$k$B on the contact metal layer 46$k$B, which is exposed through the transparent insulating material opening 50$k$B. The contact metal layer 46$a$PDB (see FIG. 5) serves as the anode pad 44B. Finally, as illustrated in FIG. 11G, the manufacturing apparatus 60 forms the cathode common wiring 17 on the upper surface of the transparent insulating material 28B.

<1-6-4. Process of Stacking and Bonding>

Next, a process of stacking and bonding the first thin-film layer 20R, second thin-film layer 20G, and third thin-film layer 20B manufactured by the above manufacturing methods onto the circuit substrate 10 will be described with reference to FIGS. 12A to 12C.

First, as illustrated in FIG. 12A, the manufacturing apparatus 60 separates the first thin-film layer 20R from the formation substrate 68R by etching and removing the sacrificial layer 70R (see FIG. 9G). Thereby, the pillar structure lower surface 41$a$GS2, pillar structure lower surface 41$a$B1S2 (see FIG. 5), and anode pad surface 44RS (see FIG. 5) are exposed from the lower surface (or surface on the −Z direction side) of the base transparent insulating material 26R. The pillar structure lower surface 41$a$GS2, pillar structure lower surface 41$a$B1S2 (see FIG. 5), and anode pad surface 44RS are formed to be smooth in the same plane, following the upper surface of the sacrificial layer 70R (see FIG. 9G). Then, the manufacturing apparatus 60 bonds the separated first thin-film layer 20R to the upper surface of the circuit substrate 10 by means of intermolecular force by using a known bonding method.

Then, as illustrated in FIG. 12B, the manufacturing apparatus 60 separates the second thin-film layer 20G from the formation substrate 68G by etching and removing the sacrificial layer 70G (see FIG. 10G). Thereby, the pillar structure lower surface 39$k$BS2, anode pad surface 44GS, and pillar structure lower surface 41$a$B2S2 (see FIG. 5) are exposed from the lower surface (or surface on the −Z direction side) of the base transparent insulating material 26G. The pillar structure lower surface 39$k$BS2, anode pad surface 44GS, and pillar structure lower surface 41$a$B2S2 (see FIG. 5) are formed to be smooth in the same plane, following the upper surface of the sacrificial layer 70G (see FIG. 10G). Then, the manufacturing apparatus 60 bonds the separated second thin-film layer 20G to the upper surface of the first thin-film layer 20R bonded to the circuit substrate 10 in FIG. 12A, by means of intermolecular force by using a known bonding method.

Then, as illustrated in FIG. 12C, the manufacturing apparatus 60 separates the third thin-film layer 20B from the formation substrate 68B by etching and removing the sacrificial layer 70B (see FIG. 11G). Thereby, the pillar structure lower surface 39$k$BS2 and anode pad surface 44BS (see FIG. 5) are exposed from the lower surface (or surface on the −Z direction side) of the base transparent insulating material 26B. The pillar structure lower surface 39$k$BS2 and anode pad surface 44BS (see FIG. 5) are formed to be smooth in the same plane, following the upper surface of the sacrificial layer 70B (see FIG. 11G). Then, the manufacturing apparatus 60 bonds the separated third thin-film layer 20B to the upper surface of the second thin-film layer 20G bonded to the first thin-film layer 20R in FIG. 12B, by means of intermolecular force by using a known bonding method.

<1-7. Operation>

In the LED display device 1 with the above configuration, when the LED display portion 2 is driven, power, a clock signal, image data, and the like are input to the driver 6 through the connection terminal portion 5 from an external circuit (not illustrated). Then, in the LED display device 1, signals for turning on/off the active elements 14R, 14G, and 14B and drive currents are selectively supplied from the driver 6 to the wiring layer 16 of the circuit substrate 10. The supplied drive currents are supplied to the thin-film LEDs 30R, 30G, and 30B through the connection pads 12, the vertical wirings 22R, 22G, and 22B, the lead-out wirings 36 in the thin-film layers (i.e., first thin-film layer 20R, second thin-film layer 20G, and third thin-film layer 20B), in accordance with turning on/off of the active elements 14R, 14G, and 14B. Thereby, the LED display portion 2 emits light.

<1-8. Difference Between Passive Matrix Method and Active Matrix Method>

Methods of driving LED display devices are roughly classified into two: a passive matrix method and an active matrix method.

The passive matrix method is a method of selectively turning on pixels at intersections of vertical wires (or signal input electrodes) and horizontal wires (or scanning electrodes) in matrix wiring. An LED display device using the passive matrix method controls light emission line by line in a time-division manner by scanning the scanning electrodes.

On the other hand, the active matrix method is a method of disposing a switching element (also referred to as active element) including a transistor and a capacitor for each pixel of an LED display portion and controlling turning on and off of the pixels by controlling the gate voltages of the transistors. When a pixel is turned on, the capacitor of the active element is charged, and thus the pixel can maintain the on-state, i.e., the light emitting state, even while the pixel is not selected through the scanning electrode. The active matrix method has the advantages of having short response time, producing vivid colors, and prolonging the lives of the elements, as compared to the passive matrix method, and is used in many commonly used displays. In an LED display device using the active matrix method, an active element is connected to a terminal of a light emitting element of each sub-pixel. Thus, in general, active elements are arranged in a matrix on a circuit substrate, and a light emitting element is connected to and formed on each active element.

<1-9. Advantages>

In the above configuration, the LED display device 1 is configured such that in the first thin-film layer 20R, the first thin-film layer opening 52aG is formed from the first thin-film layer upper surface 20RS1 facing the second thin-film layer 20G in the light emitting direction De to the first thin-film layer lower surface 20RS2 facing the circuit substrate 10 in the light emitting direction De, the conductive pillar structure 41aG serving as an electrode (constituted by the anode pillar 42aG and contact metal layer 46aPL1R) is disposed in the first thin-film layer opening 52aG, and the anode electrode 32G of the thin-film LED 30G and the connection pad 12G of the circuit substrate 10 are electrically connected together through the conductive pillar structure 41aG.

Also, the LED display device 1 is configured such that in the first thin-film layer 20R, the first thin-film layer opening 52aB1 serving as a second opening is formed from the first thin-film layer upper surface 20RS1 to the first thin-film layer lower surface 20RS2 in a region that does not overlap the first thin-film layer opening 52aG as viewed in the light emitting direction De, and the conductive pillar structure 41aB1 serving as an electrode (constituted by the anode pillar 42aB1 and contact metal layer 46aPL2R) is disposed in the first thin-film layer opening 52aB1. The LED display device 1 is configured such that in the second thin-film layer 20G, the second thin-film layer opening 52aB2 serving as a third opening is formed from the second thin-film layer upper surface 20GS1 serving as a fourth surface to the second thin-film layer lower surface 20GS2 serving as a third surface in a region that overlaps the first thin-film layer opening 52aB1 as viewed in the light emitting direction De, and the conductive pillar structure 41aB2 serving as an electrode (constituted by the anode pillar 42aB2 and contact metal layer 46aPLG) is disposed in the second thin-film layer opening 52aB2. The LED display device 1 is configured such that the anode electrode 32B of the thin-film LED 30B and the connection pad 12B of the circuit substrate 10 are electrically connected together through the conductive pillar structures 41aB1 and 41aB2 respectively disposed in the first thin-film layer opening 52aB1 and second thin-film layer opening 52aB2.

Moreover, the LED display device 1 is configures such that in the first thin-film layer 20R, the anode pad 44R is disposed in a region that does not overlap any of the first thin-film layer opening 52aG, first thin-film layer opening 52aB1, and second thin-film layer opening 52aB2 as viewed in the light emitting direction De, and the anode electrode 32R of the thin-film LED 30R and the connection pad 12R of the circuit substrate 10 are electrically connected together through the anode pad 44R.

Thereby, the LED display device 1 can cause current to flow from the circuit substrate 10 to each of the anode electrodes 32R, 32G, and 32B of the thin-film LEDs 30R, 30G, and 30B stacked in the light emitting direction De.

Moreover, the LED display device 1 is configured such that in the first thin-film layer 20R, second thin-film layer 20G, and third thin-film layer 20B, the vertical wiring 22K constituted by the conductive pillar structures 39kR, 39kB, and 39kB is disposed in a region that does not overlap any of the first thin-film layer openings 52aG and 52aB1, second thin-film layer opening 52aB2, and anode pad 44R as viewed in the light emitting direction De, and the cathode electrode 34R of the thin-film LED 30R, the cathode electrode 34G of the thin-film LED 30G, and the cathode electrode 34B of the thin-film LED 30B are electrically connected to the cathode common wiring 17 through the conductive pillar structures 39kR, 39kB, and 39kB. Thereby, the LED display device 1 can cause current to flow from each of the cathode electrodes 34R, 34G, and 34B of the thin-film LEDs 30R, 30G, and 30B stacked in the light emitting direction De to the cathode common wiring 17.

Moreover, the LED display device 1 is configured such that in the first thin-film layer 20R, there is disposed the lead-out wiring 36aR, serving as a first lead-out line, that extends from the anode electrode 32R, serving as a terminal of one polarity of the thin-film LED 30R, in the −X and +Y direction (see FIG. 6), which is a first direction, and electrically connects the thin-film LED 30R and the connection pad 12R of the circuit substrate 10. Moreover, the LED display device 1 is configured such that in the second thin-film layer 20G, there is disposed the lead-out wiring 36aG, serving as a second lead-out line, that extends from the anode electrode 32G, serving as a terminal of one polarity of the thin-film LED 30G, toward the first thin-film layer opening 52aG in the +X and +Y direction (see FIG. 7), which is a second direction and different from the −X and +Y direction, and electrically connects the thin-film LED 30G and the connection pad 12G of the circuit substrate 10 through the conductive pillar structure 41aG in the first thin-film layer opening 52aG. Thus, the LED display device 1 is configured such that the lead-out wirings 36aR and 36aG extend in different directions and occupy regions that do not overlap.

Moreover, the LED display device 1 is configured such that in the first thin-film layer 20R, there is disposed the lead-out wiring 36kR, serving as a third lead-out line, that extends from the cathode electrode 34R, serving as a terminal of another polarity of the thin-film LED 30R, in the −X and −Y direction (see FIG. 6), which is a third direction and different from the −X and +Y direction and +X and +Y direction. Moreover, the LED display device 1 is configured such that in the second thin-film layer 20G, there is disposed the lead-out wiring 36kG, serving as a fourth lead-out line, that extends from the cathode electrode 34G, serving as a terminal of another polarity of the thin-film LED 30G, in the −X and −Y direction (see FIG. 7) and is electrically connected to the lead-out wiring 36kR.

As above, the LED display device 1 is configured such that the anode electrodes 32R, 32G, and 32B are electrically connected to the circuit substrate 10 through the vertical wirings 22R, 22G, and 22B disposed in the thin-film layers 20 at different positions as viewed in the light emitting direction De, and the cathode electrodes 34R, 34G, and 34B are electrically connected to the cathode common wiring 17 through the vertical wiring 22K disposed in the thin-film layers 20 at a position different from those of the vertical wirings 22R, 22G, and 22B as viewed in the light emitting direction De.

Thereby, the LED display device 1 can control, by means of the circuit substrate 10, light emission of the thin-film LED 30R in the first thin-film layer 20R, light emission of the thin-film LED 30G in the second thin-film layer 20G in which the thin-film LED 30G is disposed such that the thin-film LED 30G is stacked on the thin-film LED 30R in the light emitting direction De to overlap the thin-film LED 30R, with the first thin-film layer 20R between the second thin-film layer 20G and the circuit substrate 10, and light emission of the thin-film LED 30B in the third thin-film layer 20B in which the thin-film LED 30B is disposed such that the thin-film LED 30B is stacked on the thin-film LEDs 30R and 30G in the light emitting direction De to overlap each of the thin-film LEDs 30R and 30G, with the first thin-film layer 20R and second thin-film layer 20G between the third thin-film layer 20B and the circuit substrate 10. Thus, the LED display device 1 is formed as a stacked light emitting device capable of being driven by active matrix driving, and can provide advantages of active matrix driving with the LED display portion 2 having high-density pixels.

As above, the LED display device 1 includes the first thin-film layer 20R in which the thin-film LED 30R, serving as a first light emitting element, is disposed; the second thin-film layer 20G stacked on the first thin-film layer 20R and including the thin-film LED 30G, serving as a second light emitting element, that at least partially overlaps the thin-film LED 30R as viewed in the light emitting direction De perpendicular to the light emitting surface of the thin-film LED 30R; and the circuit substrate 10 on which the first thin-film layer 20R is stacked and that controls light emission of the thin-film LEDs 30R and 30G. The first thin-film layer 20R includes the first thin-film layer upper surface 20RS1, serving as a first surface, facing the second thin-film layer 20G in the light emitting direction De, the first thin-film layer lower surface 20RS2, serving as a second surface, facing the circuit substrate 10 in the light emitting direction De, and the first thin-film layer opening 52aG, serving as a first opening, formed from the first thin-film layer upper surface 20RS1 to the first thin-film layer lower surface 20RS2. The thin-film LED 30G and circuit substrate 10 are electrically connected together through the first thin-film layer opening 52aG.

Thereby, the LED display device 1 can control, by means of the circuit substrate 10, light emission of the thin-film LED 30G in the second thin-film layer 20G in which the thin-film LED 30G is disposed such that the thin-film LED 30G is stacked on the thin-film LED 30R in the light emitting direction De to overlap the thin-film LED 30R, with the first thin-film layer 20R between the second thin-film layer 20G and the circuit substrate 10.

The vertical wirings 22 are formed in the thin-film layers 20 by forming the openings 48R, 52aG, 48G, 52aB1, 52aB2, 48B, 50kR, 52kG, and 52kB in regions of the transparent insulating materials 26R, 28R, 26G, 28G, 26B, and 28B that do not overlap any of the thin-film LEDs 30 as viewed in the Z direction and forming the anode pads 44R, 44G, and 44B and conductive pillar structures 41aG, 41aB1, 41aB2, 39kR, 39kB, and 39kB. This allows light emitted from the thin-film LEDs 30 to be guided in the +Z direction without being blocked by the vertical wirings 22.

The first thin-film layer opening 52aG (or conductive pillar structure 41aG) is disposed outside the thin-film LED 30R as viewed in the light emitting direction De. This can prevent the first thin-film layer opening 52aG (or conductive pillar structure 41aG) from blocking light emitted from the thin-film LED 30R. The first thin-film layer opening 52aB1 (or conductive pillar structure 41aB1) is disposed outside the thin-film LED 30R as viewed in the light emitting direction De. This can prevent the first thin-film layer opening 52aB1 (or conductive pillar structure 41aB1) from blocking light emitted from the thin-film LED 30R. The second thin-film layer opening 52aB2 (or conductive pillar structure 41aB2) is disposed outside the thin-film LEDs 30R and 30G as viewed in the light emitting direction De. This can prevent the second thin-film layer opening 52aB2 (or conductive pillar structure 41aB2) from blocking light emitted from the thin-film LEDs 30R and 30G.

The surface roughnesses of the upper surfaces of the thin-film LEDs 20R and 20G and the lower surfaces of the thin-film LEDs 20R, 20G, and 20B are 10 nm or less. This allows the thin-film layers 20 to be stacked without using adhesive or the like. This also allows the thin-film LEDs 30 of the respective thin-film layers 20 to be electrically connected to the connection pads 12R, 12G, and 12B of the circuit substrate 10.

With this embodiment, it is possible to provide an inexpensive LED display device with high pixel density in which light emitting elements are stacked in the light emitting direction and that uses the active matrix method, which provides higher image quality than the passive matrix method.

2. Second Embodiment

<2-1. Process of Stacking and Bonding>

As illustrated in FIGS. 13A to 13C, in which elements corresponding to those in FIGS. 12A to 12C are given the same reference characters, an LED display device 1 according to a second embodiment is different from the LED display device 1 according to the first embodiment in the process of stacking and bonding the first thin-film layer 20R, second thin-film layer 20G, and third thin-film layer 20B onto the circuit substrate 10, but otherwise formed in the same manner.

First, as illustrated in FIG. 13A, the manufacturing apparatus 60 separates the second thin-film layer 20G from the formation substrate 68G by etching and removing the sacrificial layer 70G (see FIG. 10G). Thereby, the pillar structure lower surface 39kBS2, anode pad surface 44GS, and pillar structure lower surface 41aB2S2 (see FIG. 5) are exposed from the lower surface (or surface on the −Z direction side) of the base transparent insulating material 26G. The pillar structure lower surface 39kBS2, anode pad surface 44GS, and pillar structure lower surface 41aB2S2 (see FIG. 5) are formed to be smooth in the same plane, following the upper surface of the sacrificial layer 70G (see FIG. 10G). Then, the manufacturing apparatus 60 bonds the separated second thin-film layer 20G to the upper surface of the first thin-film layer 20R on the formation substrate 68R, by means of intermolecular force by using a known bonding method.

Then, as illustrated in FIG. 13B, the manufacturing apparatus 60 separates the third thin-film layer 20B from the formation substrate 68B by etching and removing the sacrificial layer 70B (see FIG. 11G). Thereby, the pillar structure lower surface 39kBS2 and anode pad surface 44BS (see FIG. 5) are exposed from the lower surface (or surface on the −Z direction side) of the base transparent insulating material 26B. The pillar structure lower surface 39kBS2 and anode pad surface 44BS (see FIG. 5) are formed to be smooth in the same plane, following the upper surface of the sacrificial layer 70B (see FIG. 11G). Then, the manufacturing apparatus 60 bonds the separated third thin-film layer 20B to the upper surface of the second thin-film layer 20G bonded to the first thin-film layer 20R in FIG. 13A, by means of intermolecular force by using a known bonding method.

Then, as illustrated in FIG. 13C, the manufacturing apparatus 60 separates the first thin-film layer 20R to which the second thin-film layer 20G and third thin-film layer 20B have been bonded in FIGS. 13A and 13B, from the formation substrate 68R by etching and removing the sacrificial layer 70R (see FIG. 9G). Thereby, the pillar structure lower surface 41aGS2, pillar structure lower surface 41aB1S2 (see FIG. 5), and anode pad surface 44RS (see FIG. 5) are exposed from the lower surface (or surface on the −Z direction side) of the base transparent insulating material 26R. The pillar structure lower surface 41aGS2, pillar structure lower surface 41aB1S2 (see FIG. 5), and anode pad surface 44RS are formed to be smooth in the same plane, following the upper surface of the sacrificial layer 70R (see FIG. 9G). Then, the manufacturing apparatus 60 bonds the separated first thin-film layer 20R with the second thin-film layer 20G and third thin-film layer 20B bonded thereto, to the circuit substrate 10 by means of intermolecular force by using a known bonding method.

The LED display device 1 according to the second embodiment can provide the same effects and advantages as the LED display device 1 according to the first embodiment.

3. Third Embodiment

<3-1. Configuration of Semiconductor Structure>

Figure 14:
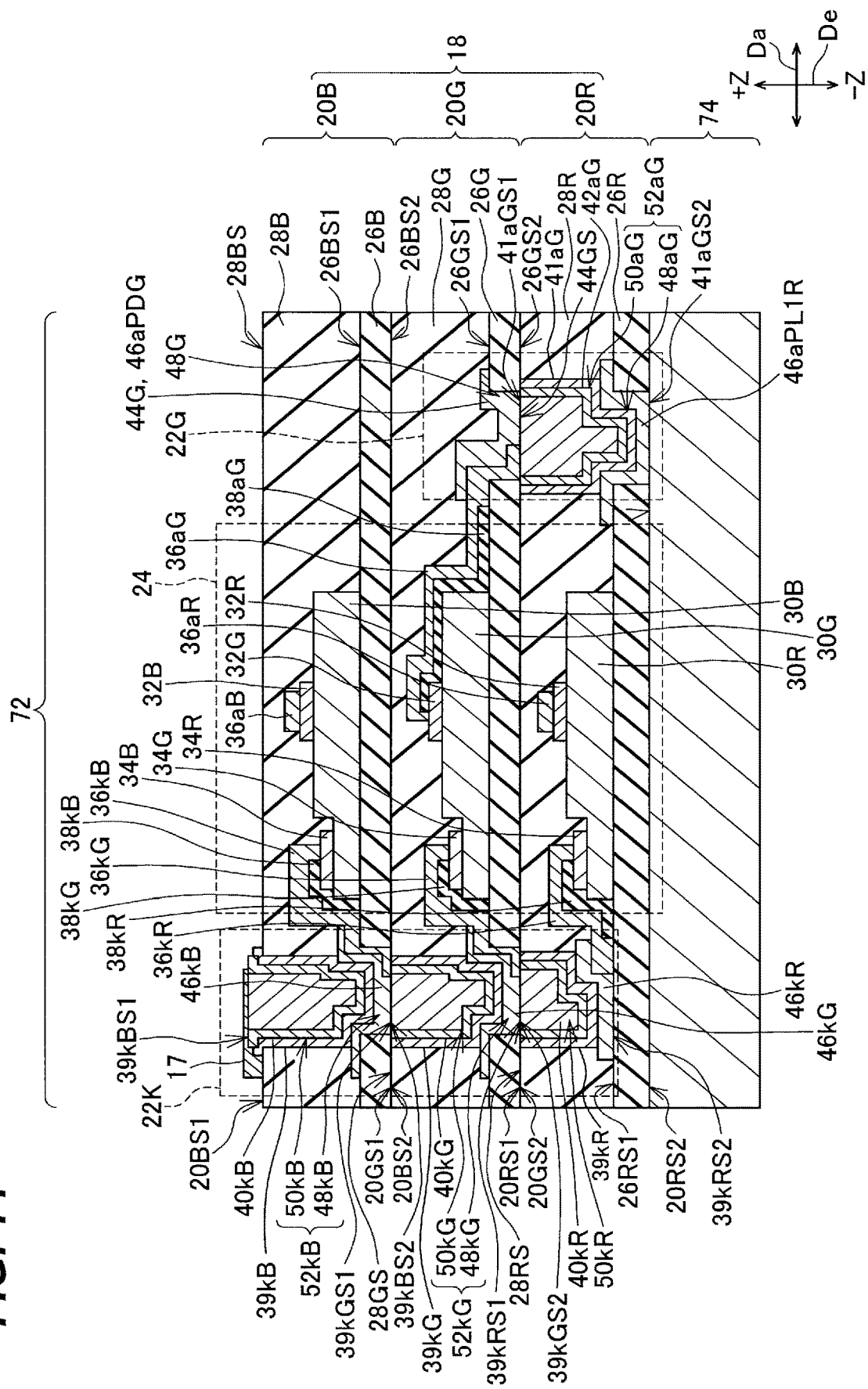
FIG. 14 is a first cross-sectional view illustrating a configuration of a semiconductor structure according to a third embodiment.
Figure 15:
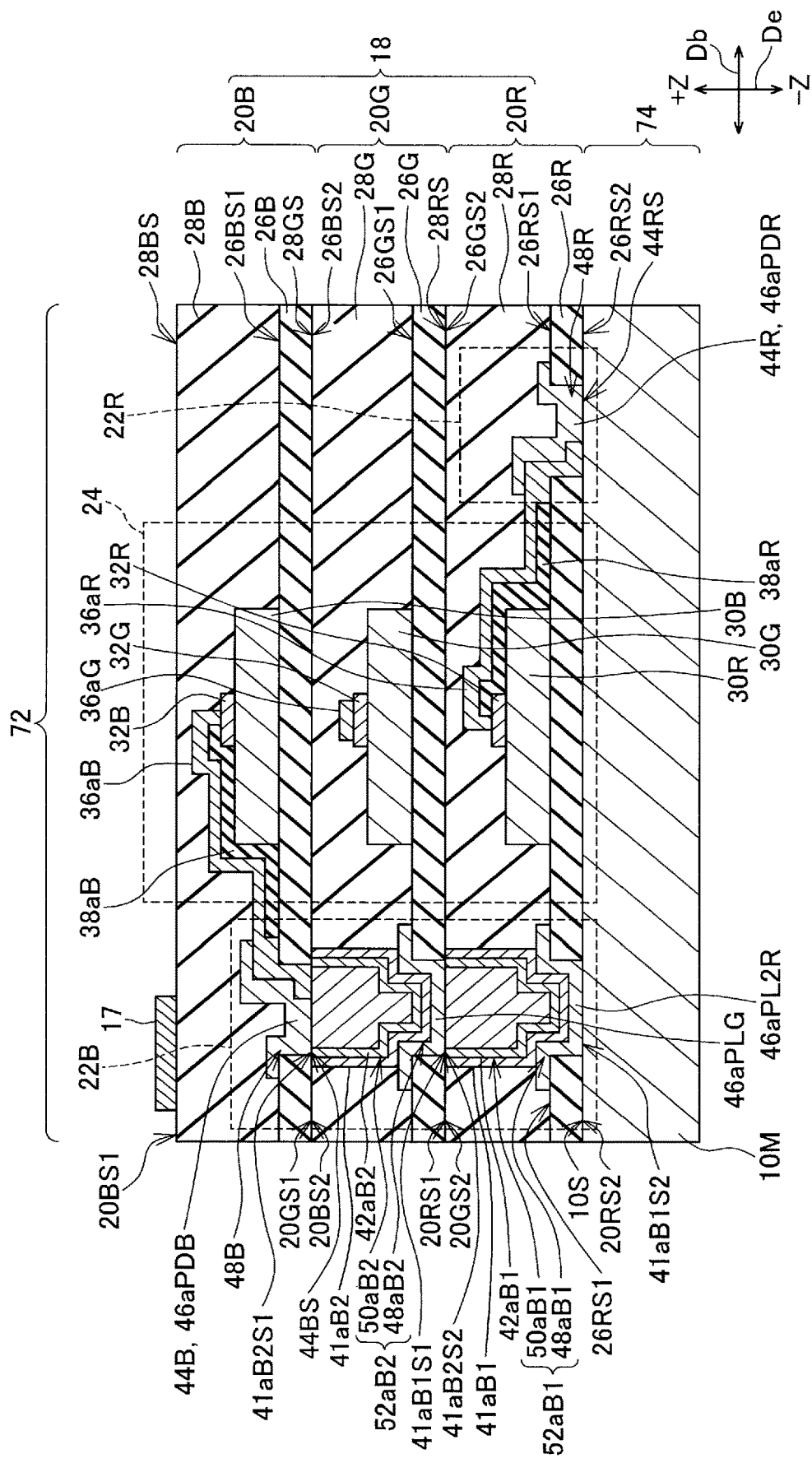
FIG. 15 is a second cross-sectional view illustrating the configuration of the semiconductor structure according to the third embodiment.

As illustrated in FIGS. 14 and 15, in which elements corresponding to those in FIGS. 4 and 5 are given the same reference characters, a semiconductor structure 72 according to a third embodiment is different from the LED display portion 2 according to the first embodiment in that a support substrate 74 is provided instead of the circuit substrate 10, but otherwise formed in the same manner. The semiconductor structure 72 has a configuration in which the thin-film layer group 18 constituted by the three thin-film layers, the first thin-film layer 20R, second thin-film layer 20G, and third thin-film layer 20B, is stacked on the support substrate 74.

<3-2. Process of Stacking and Bonding>

Figures 16A, 16B, 16C:
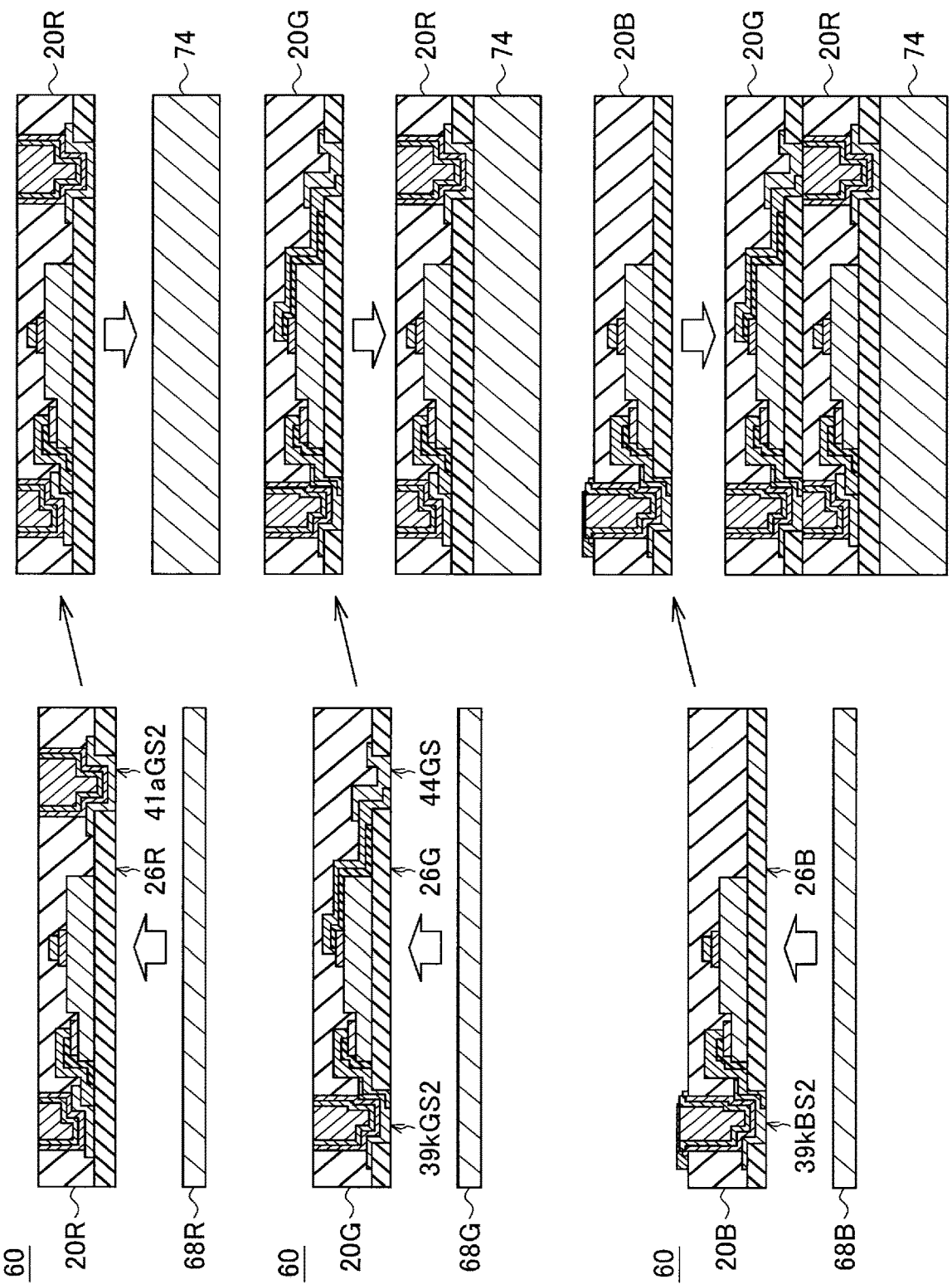
FIGS. 16A to 16C are cross-sectional views illustrating a process of manufacturing the semiconductor structure according to the third embodiment.

As illustrated in FIGS. 16A to 16C, in which elements corresponding to those in FIGS. 12A to 12C are given the same reference characters, the semiconductor structure 72 according to the third embodiment is different from the LED display portion 2 according to the first embodiment in that the support substrate 74 is provided instead of the circuit substrate 10, but otherwise formed in the same manner. Thus, the description of the process of stacking and bonding for the semiconductor structure 72 according to the third embodiment will be omitted.

<3-3. Advantages, etc.>

The semiconductor structure 72 according to the third embodiment can provide the same effects and advantages as the LED display portion 2 according to the first embodiment.

The semiconductor structure 72 with the above configuration includes the support substrate 74, serving as a substrate; the first thin-film layer 20R, serving as a first layer, disposed on the support substrate 74 and including the thin-film LED 30R, serving as a first light emitting element; and the second thin-film layer 20G, serving as a second layer, stacked on the first thin-film layer 20R in a stacking direction and including the thin-film LED 30G, serving as a second light emitting element, that at least partially overlaps the thin-film LED 30R as viewed in the stacking direction. Here, when the first thin-film layer opening 52aG (see FIG. 14) is considered to serve as an opening in which a first electrode is disposed, the conductive pillar structure 41aG serves as the first electrode, and the anode pad 44G serves as a second electrode. On the other hand, when the first thin-film layer opening 52aB1 (see FIG. 15) is considered to serve as the opening in which the first electrode is disposed, the conductive pillar structure 41aB1 serves as the first electrode, and the conductive pillar structure 41aB2 serves as the second electrode.

4. Fourth Embodiment

<4-1. Process of Stacking and Bonding>

As illustrated in FIGS. 17A to 17C, in which elements corresponding to those in FIGS. 13A to 13C and 16A to 16C are given the same reference characters, a semiconductor structure 72 according to a fourth embodiment is different from the semiconductor structure 72 according to the third embodiment in the process of stacking and bonding the first thin-film layer 20R, second thin-film layer 20G, and third thin-film layer 20B onto the support substrate 74, but otherwise formed in the same manner.

The process of stacking and bonding for the semiconductor structure 72 according to the fourth embodiment is different from the process of stacking and bonding for the LED display device 1 according to the second embodiment (see FIGS. 13A to 13C) in that the support substrate 74 is provided instead of the circuit substrate 10, but otherwise the same. Thus, the description of the process of stacking and bonding for the semiconductor structure 72 according to the fourth embodiment will be omitted.

<4-2. Advantages, Etc.>

The semiconductor structure 72 according to the fourth embodiment can provide the same effects and advantages as the semiconductor structure 72 according to the third embodiment.

5. Other Embodiments

In the first embodiment, the anode electrode 32G of the thin-film LED 30G and the connection pad 12G of the circuit substrate 10 are electrically connected together through the conductive pillar structure 41aG formed in the first thin-film layer opening 52aG of the first thin-film layer 20R. However, this is not mandatory. It is possible that a wiring of any suitable type is formed in the first thin-film layer opening 52aG of the first thin-film layer 20R, and the anode electrode 32G of the thin-film LED 30G and the connection pad 12G of the circuit substrate 10 are electrically connected together through the wiring. It is sufficient that the first thin-film layer opening 52aG be formed in the first thin-film layer 20R, and the anode electrode 32G of the thin-film LED 30G and the connection pad 12G of the circuit substrate 10 be electrically connected together through an electric conductor (or electrode) of any suitable type provided in the thin-film layer opening 52aG. The same applies to the first thin-film layer opening 52aB1, second thin-film layer openings 52kG and 52aB2, and third thin-film layer opening 52kB. The same applies to the second embodiment.

In the first embodiment, the thin-film LEDs 30R, 30G, and 30B are stacked to overlap such that their centers coincide as viewed in the Z direction. However, this is not mandatory. It is sufficient that the thin-film LEDs 30R, 30G, and 30B be stacked to at least partially overlap as viewed in the Z direction. The same applies to the second to fourth embodiments.

In the first embodiment, the thin-film LEDs 30R, 30G, and 30B have the same size in a planar view. However, this is not mandatory. The thin-film LEDs 30R, 30G, and 30B may have different sizes. For example, the thin-film LED 30R may be larger than the thin-film LED 30B, or, conversely, the thin-film LED 30B may be larger than the thin-film LED 30R. It is sufficient that the thin-film LEDs 30R, 30G, and 30B at least partially overlap as viewed in the Z direction. The same applies to the second to fourth embodiments.

In the first embodiment, light emitted by the thin-film LEDs 30R, 30G, and 30B decreases in wavelength in the +Z direction. However, this is not mandatory. For example, the arrangement of the thin-film LEDs 30R, 30G, and 30B may be changed depending on the luminous efficiencies of the respective light emitting elements, i.e., the thin-film LEDs 30R, 30G, and 30B. The same applies to the second to fourth embodiments.

In the first embodiment, the cathode common wiring 17 is formed on the third thin-film layer upper surface 20BS1. However, this is not mandatory. The cathode common wiring 17 may be disposed on the substrate surface 10S of the circuit substrate 10, in the circuit substrate 10, or at other locations. When the cathode common wiring 17 is disposed in the circuit substrate 10, it is possible that a connection pad for a cathode is disposed on the substrate surface 10S and connected to the lower surface of the conductive pillar structure 39kR of the first thin-film layer 20R. In this case, the connection pad 12NC may be used as the cathode pad with no active element connected thereto. The same applies to the second embodiment.

In the first embodiment, the connection pad 12NC is connected to none of the anodes. However, this is not mandatory. For the purpose of increasing the maximum light emission intensity of one of the thin-film LEDs 30R, 30G, and 30B to improve the color balance or for other purposes, it is possible that one of the thin-film LEDs 30R, 30G, and 30B is connected to the connection pad 12NC and supplied with power from two connection pads 12: the corresponding one of the connection pads 12R, 12G, and 12B, and the connection pad 12NC. Alternatively, the connection pad 12NC may be omitted. The same applies to the second embodiment.

In the first embodiment, the size of each thin-film layer 20 is the same as the display size of the LED display portion 2. However, this is not mandatory. Each thin-film layer 20 may be divided into two or more parts while the total number and pitches of pixels of the LED display portion 2 are maintained. For example, the third thin-film layer 20B may be divided into two parts so that the size of each part is half the display size. In this case, the number of pixels included in each part of the third thin-film layer 20B is half the total number of pixels of the LED display portion 2. However, when the third thin-film layer 20B is divided into two or more parts, the number of pixels included in each part may be any number greater than or equal to 1 and less than the total number of pixels of the LED display portion 2. When the third thin-film layer 20B is divided into two or more parts, the size of each part is smaller than that of the entire third thin-film layer 20B. Thus, in stacking and bonding the parts of the third thin-film layer 20B onto the second thin-film layer 20G, it is easy to position them. The same applies to the second to fourth embodiments.

In the first embodiment, in the method of manufacturing the first thin-film layer 20R (see FIG. 9C), the thin-film LED layer 66R is bonded to the base transparent insulating material 26R and then etched (see FIG. 9D). However, this is not mandatory. It is possible to perform processing and wiring on the thin-film LED layer 66R in the state of FIG. 9A in which the thin-film LED layer 66R is located above the LED growth substrate 62R, and then bond the thin-film LED layer 66R to the base transparent insulating material 26R. It is also possible, after the thin-film LED 30R is formed by patterning, to bond the thin-film LED 30R onto the base transparent insulating material 26R by means of intermolecular force. The same applies to the methods of manufacturing the second thin-film layer 20G and third thin-film layer 20B. However, in practice, this method is difficult to implement when the pixels are small. The same applies to the second to fourth embodiments.

In the first embodiment, an active element 14 is constituted by two MOS transistors and one capacitor. However, this is not mandatory. In addition to two MOS transistors and one capacitor that form the basic structure, an active element 14 may include one or more circuits having other various functions, such as a circuit that performs gray-level control, a compensation circuit, or a redundant circuit. The same applies to the second embodiment.

In the first embodiment, the driver 6 is mounted on a surface of the circuit substrate 10. However, this is not mandatory. The driver 6 may be mounted on a surface of the connection cable 4, or may be formed as CMOS circuitry in the circuit substrate 10 by a semiconductor process. The same applies to the second embodiment.

In the first embodiment, the circuit substrate 10 is formed by a CMOS circuit substrate. However, this is not mandatory. The circuit substrate 10 may be formed by a thin-film transistor (TFT) circuit substrate. The same applies to the second embodiment.

Figure 18:
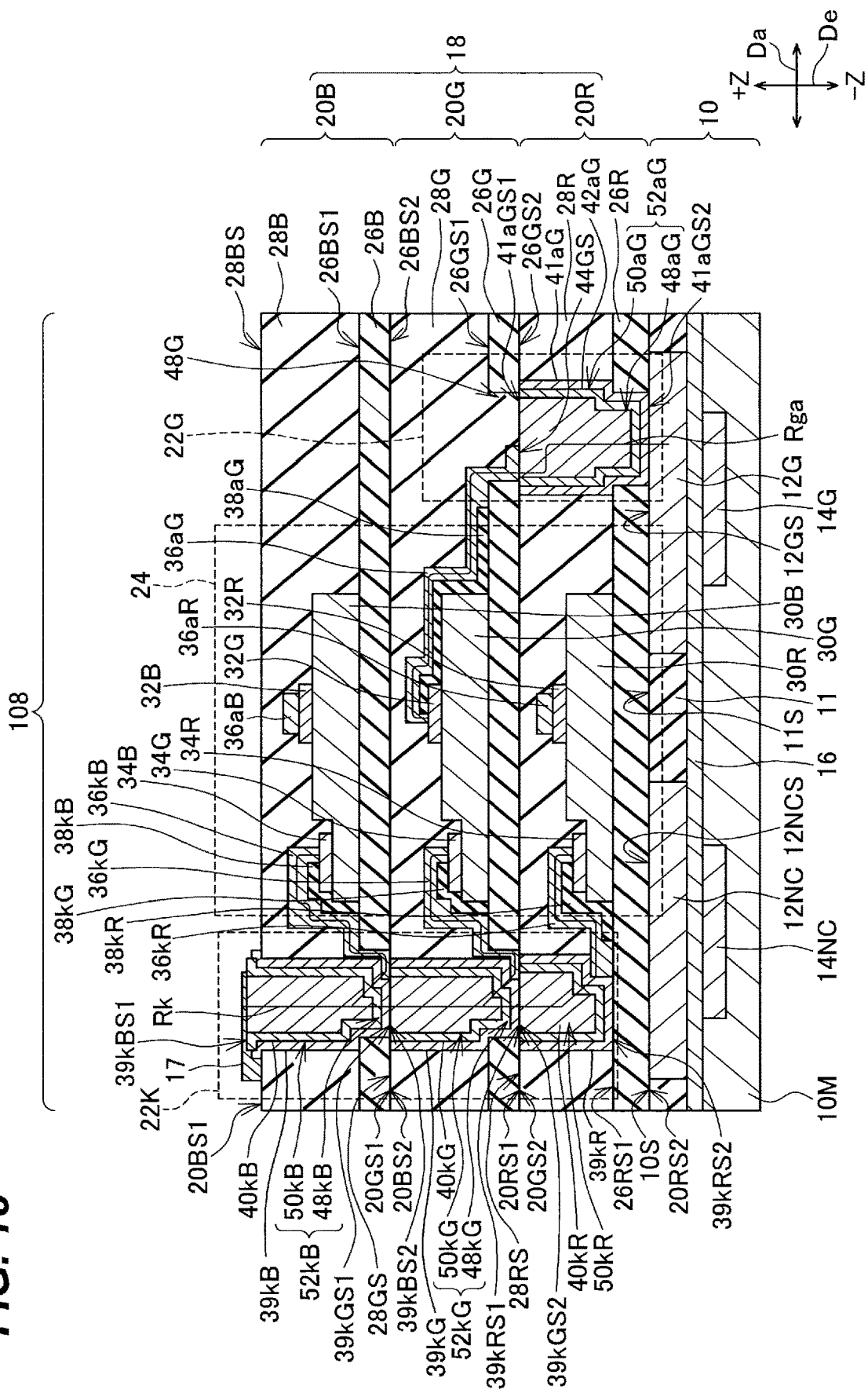
FIG. 18 is a first cross-sectional view illustrating a configuration of a pixel portion according to another embodiment.
Figure 19:
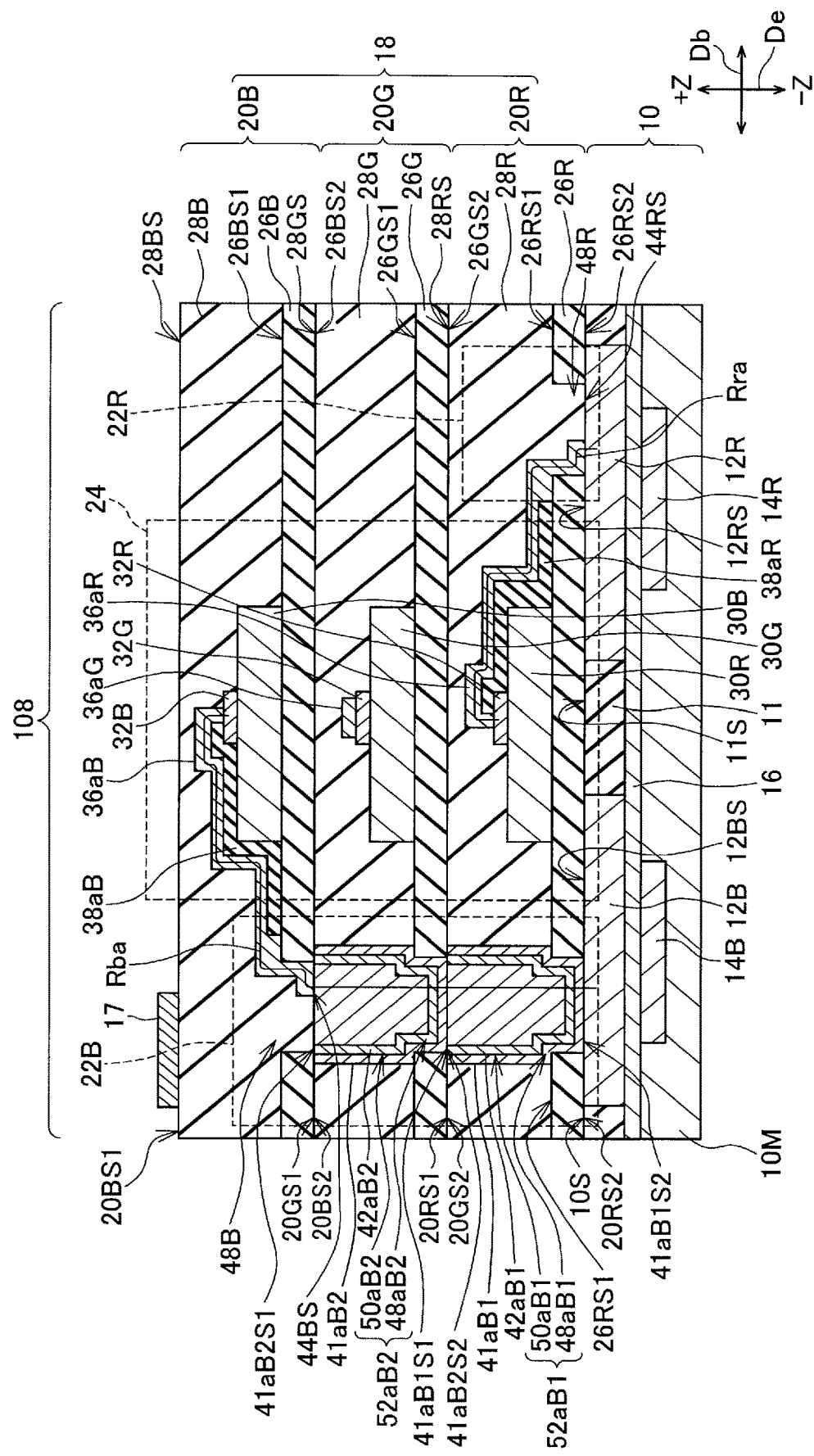
FIG. 19 is a second cross-sectional view illustrating the configuration of the pixel portion according to the other embodiment.

In the first embodiment, the contact metal layers 46kR, 46aPL1R, 46aPL2R, 46aPDR, 46kG, 46aPLG, 46aPDG, 46kB, and 46aPDB may be omitted, as in a pixel portion 108 illustrated in FIGS. 18 and 19, in which elements corresponding to those in FIGS. 4 and 5 are given the same reference characters. In this case, the lower surface of the barrier layer of the cathode pillar 40kR (see FIG. 18) serves as the pillar structure lower surface 39kRS2, the lower surface of the barrier layer of the anode pillar 42aG (see FIG. 18) serves as the pillar structure lower surface 41aGS2, the lower surface of the barrier layer of the anode pillar 42aB1 (see FIG. 19) serves as the pillar structure lower surface 41aB1S2, the lower surface of the lead-out wiring 36aR (see FIG. 19) serves as the anode pad surface 44RS, the lower surface of the barrier layer of the cathode pillar 40kG (see FIG. 18) serves as the pillar structure lower surface 39kBS2, the lower surface of the barrier layer of the anode pillar 42aB2 (see FIG. 19) serves as the pillar structure lower surface 41aB2S2, the lower surface of the lead-out wiring 36aG (see FIG. 18) serves as the anode pad surface 44GS, the lower surface of the barrier layer of the cathode pillar 40*k*B (see FIG. 18) serves as the pillar structure lower surface 39*k*BS2, and the lower surface of the lead-out wiring 36*a*B (see FIG. 18) serves as the anode pad surface 44BS. The same applies to the second to fourth embodiments.

In the first embodiment, for example, the cathode pillar 40*k*R (see FIGS. 9A to 9G) is formed by disposing the barrier layer 54*k*R, seed metal layer 56*k*R, and plated portion 58*k*R on the contact metal layer 46*k*R. However, this is not mandatory. The cathode pillar 40*k*R may be formed by a single metal by a plating method with the contact metal layer 46*k*R as a seed metal layer, a sputtering method, a chemical vapor deposition (CVD) method, or the like. The same applies to the anode pillar 42*a*G, anode pillar 42*a*B1, cathode pillar 40*k*G, anode pillar 42*a*B2, and cathode pillar 40*k*B. The same applies to the second to fourth embodiments.

In the first embodiment, the conductive pillar structure 41*a*G is constituted by the anode pillar 42*a*G and contact metal layer 46*a*PL1R. However, the conductive pillar structure 41*a*G may have other configurations. It is sufficient that the conductive pillar structure 41*a*G be an electric conductor, such as a metallic member, disposed in the first thin-film layer opening 52*a*G from the first thin-film layer upper surface 20RS1 to the first thin-film layer lower surface 20RS2. The conductive pillar structure 41*a*G may be a single layer, or may be formed by a single material. The same applies to the other conductive pillar structures. The same applies to the second to fourth embodiments.

In the first embodiment, the lead-out wirings 36*a*R, 36*a*G, and 36*a*B are connected to the anode pads 44R, 44G, and 44B, respectively. However, this is not mandatory. The lead-out wiring 36*a*R and anode pad 44R may be formed by the same material in the form of a single body, and may be a single transparent electrode. The lead-out wiring 36*a*G and anode pad 44G may be formed by the same material in the form of a single body, and may be a single transparent electrode. The lead-out wiring 36*a*B and anode pad 44B may be formed by the same material in the form of a single body, and may be a single transparent electrode. The same applies to the second to fourth embodiments.

In the first embodiment, the lead-out wirings 36*k*R, 36*k*G, and 36*k*B are connected to the contact metal layers 46*k*R, 46*k*G, and 46*k*B, respectively. However, this is not mandatory. The lead-out wiring 36*k*R and contact metal layer 46*k*R may be formed by the same material in the form of a single body, and may be a single transparent electrode. The lead-out wiring 36*k*G and contact metal layer 46*k*G may be formed by the same material in the form of a single body, and may be a single transparent electrode. The lead-out wiring 36*k*B and contact metal layer 46*k*B may be formed by the same material in the form of a single body, and may be a single transparent electrode. The same applies to the second to fourth embodiments.

In the first embodiment, in the first thin-film layer 20R, the lead-out wirings 36*a*R and 36*k*R, anode pad 44R, and contact metal layers 46*a*PL1R, 46*a*PL2R, and 46*k*R may be formed by the same material, and may be transparent electrodes formed by the same material; in the second thin-film layer 20G, the lead-out wirings 36*a*G and 36*k*G, anode pad 44G, and contact metal layers 46*a*PLG and 46*k*G may be formed by the same material, and may be transparent electrodes formed by the same material; and in the third thin-film layer 20B, the lead-out wirings 36*a*B and 36*k*B, anode pad 44B, and contact metal layer 46*k*B may be formed by the same material, and may be transparent electrodes formed by the same material. The same applies to the second to fourth embodiments.

In the first embodiment, the three thin-film layers, the first thin-film layer 20R, second thin-film layer 20G, and third thin-film layer 20B, are provided in the LED display portion 2. However, this is not mandatory. It is possible to bond a fourth thin-film layer or fourth and fifth thin-film layers to the third thin-film layer 20B to increase the light output or expand the color gamut. Alternatively, it is possible to combine only two of the three thin-film layers 20, the first thin-film layer 20R, second thin-film layer 20G, and third thin-film layer 20B, to provide a two-color display. Thus, the LED display portion 2 may include two or four or more thin-film layers 20, instead of three thin-film layers 20. The same applies to the second to fourth embodiments.

In the first embodiment, techniques of the present disclosure are applied to the LED display device 1, which is a direct-view display. However, this is not mandatory. Techniques of the present disclosure may be applied to displays used as projectors or light sources. The same applies to the second to fourth embodiments.

The present disclosure is not limited to the above embodiments. Specifically, the scope of the present disclosure covers embodiments obtained by arbitrarily combining some or all of the above embodiments. Also, the scope of the present disclosure covers embodiments obtained by extracting part of the configuration described in one of the above embodiments and replacing part of the configuration of another of the above embodiments with the extracted part, and embodiments obtained by extracting part of the configuration described in one of the above embodiments and adding the extracted part to another of the above embodiments.

In the above embodiments, the LED display device 1 as a light emitting device is constituted by the first thin-film layer 20R as a first layer, the second thin-film layer 20G as a second layer, and the circuit substrate 10 as a control substrate. However, the present disclosure is not limited to this. Light emitting devices may be constituted by first layers, second layers, and control substrates that have other various configurations.

The present disclosure is applicable to, for example, LED displays with multiple LEDs arranged therein.

What is claimed is:
1. A light emitting device comprising:
a first layer in which a first light emitting element is disposed;
a second layer stacked on the first layer and including a second light emitting element that at least partially overlaps the first light emitting element as viewed from a stacking direction; and
a control substrate on which the first layer is stacked and that controls light emission of the first light emitting element and the second light emitting element,
wherein the first layer includes a first surface facing the second layer in the stacking direction, a second surface facing the control substrate in the stacking direction, and a first opening formed from the first surface to the second surface, and
wherein the second light emitting element and the control substrate are electrically connected together through the first opening,
wherein a first lead-out line is disposed in the first layer, extends from the first light emitting element in a first direction as viewed from the stacking direction, and electrically connects the first light emitting element and the control substrate, and wherein a second lead-out line is disposed in the second layer, extends from the second light emitting element toward the first opening in a second direction, different from the first direction, as viewed from the stacking direction, and electrically connects the second light emitting element and the control substrate through the first opening.

2. The light emitting device of claim 1, wherein an electrode electrically connecting the second light emitting element and the control substrate is disposed in the first opening, the first surface is formed by at least the electrode and a first insulating material covering the first light emitting element, and the second surface is formed by at least the electrode and a second insulating material on which the first light emitting element is disposed.

3. The light emitting device of claim 2, wherein in the first surface, the first insulating material and the electrode are flush with each other, and in the second surface, the second insulating material and the electrode are flush with each other.

4. The light emitting device of claim 3, wherein each of the first surface and the second surface has a surface roughness of 10 nm or less.

5. The light emitting device of claim 2, wherein the electrode is constituted by a first electric conductor and a second electric conductor that are electrically connected together, the first electric conductor includes a first exposed surface exposed from the first surface, and the second electric conductor includes a second exposed surface exposed from the second surface.

6. The light emitting device of claim 1, wherein the first layer further includes an electric conductor electrically connecting the first light emitting element and the control substrate, at a position different from a position of the first opening as viewed from the stacking direction.

7. The light emitting device of claim 1, wherein the control substrate includes:

a first connection pad electrically connected to the first light emitting element;

a second connection pad electrically connected to the second light emitting element;

a first active element electrically connected to the first connection pad; and a second active element electrically connected to the second connection pad.

8. The light emitting device of claim 1, further comprising a third layer stacked on the second layer and including a third light emitting element that at least partially overlaps each of the first light emitting element and the second light emitting element as viewed from the stacking direction, wherein the first layer further includes a second opening formed from the first surface to the second surface in a region that does not overlap the first opening as viewed from the stacking direction, the second layer further includes a third surface facing the first layer, a fourth surface facing the third layer, and a third opening formed from the third surface to the fourth surface in a region that overlaps the second opening as viewed from the stacking direction, and the third light emitting element and the control substrate are electrically connected together through the second opening and the third opening.

9. The light emitting device of claim 1, wherein the first lead-out line electrically connects a terminal of one polarity of the first light emitting element and the control substrate, the second lead-out line electrically connects a terminal of one polarity of the second light emitting element and the control substrate, and the light emitting device further comprises:

a third lead-out line that is disposed in the first layer and extends from a terminal of another polarity of the first light emitting element in a third direction different from the first direction and the second direction; and a fourth lead-out line that is disposed in the second layer, extends from a terminal of another polarity of the second light emitting element in the third direction, and is electrically connected to the third lead-out line.

10. The light emitting device of claim 8, wherein the control substrate includes, for one pixel, a first connection pad electrically connected to the first light emitting element, a second connection pad electrically connected to the second light emitting element, and a third connection pad electrically connected to the third light emitting element, and a center of each of the first light emitting element, the second light emitting element, and the third light emitting element is located inside a circumscribed rectangle of the first connection pad, the second connection pad, and the third connection pad.

11. The light emitting device of claim 1, wherein the first light emitting element and the second light emitting element are formed by different materials.

12. The light emitting device of claim 11, wherein one of the first light emitting element and the second light emitting element is formed by III-V compound semiconductor material, and another of the first light emitting element and the second light emitting element is formed by GaN-based material.

13. The light emitting device of claim 1, wherein each of the first light emitting element and the second light emitting element has a thickness of 3 μm or less in the stacking direction.

14. A semiconductor structure, comprising:

a substrate;

a first layer disposed on the substrate and including a first light emitting element; and a second layer stacked on the first layer in a stacking direction and including a second light emitting element that at least partially overlaps the first light emitting element as viewed from the stacking direction, wherein the first layer includes:

a first surface facing the second layer in the stacking direction;

a second surface facing the substrate in the stacking direction;

an opening formed from the first surface to the second surface; and a first electrode disposed in the opening, and wherein the second layer includes:

a second electrode overlapping the first electrode as viewed from the stacking direction, a first lead-out line that is disposed in the first layer, and extends from the first light emitting element in a first direction as viewed from the stacking direction, and a second lead-out line that is disposed in the second layer, and extends from the second light emitting element toward the opening in a second direction, different from the first direction, as viewed from the stacking direction.

\* \* \* \* \*